(12) United States Patent
Watanabe et al.

(10) Patent No.: US 7,914,909 B2
(45) Date of Patent: Mar. 29, 2011

(54) ORGANIC ELECTROLUMINESCENT DEVICE

(75) Inventors: Taiki Watanabe, Akishima (JP); Kazunori Ueno, Miyaki-gun (JP); Yohei Iwasaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 411 days.

(21) Appl. No.: 12/137,987

(22) Filed: Jun. 12, 2008

(65) Prior Publication Data

US 2008/0309228 A1 Dec. 18, 2008

(30) Foreign Application Priority Data

Jun. 18, 2007 (JP) ................................. 2007-160051

(51) Int. Cl.
*H01L 51/54* (2006.01)
(52) U.S. Cl. ......... 428/690; 428/917; 313/504; 313/506
(58) Field of Classification Search .................. None
See application file for complete search history.

(56) References Cited

U.S. PATENT DOCUMENTS

| | | | | |
|---|---|---|---|---|
| 5,876,864 | A * | 3/1999 | Kim et al. ............. | 428/690 |
| 6,097,147 | A | 8/2000 | Baldo et al. ............ | 313/506 |
| 6,303,231 | B1 | 10/2001 | Sawada et al. ........... | 428/470 |
| 6,553,185 | B1 | 4/2003 | Inaba et al. ............ | 396/85 |
| 6,733,905 | B2 | 5/2004 | Takiguchi et al. ........ | 428/690 |
| 6,797,980 | B2 | 9/2004 | Takiguchi et al. ........ | 257/40 |
| 6,821,645 | B2 | 11/2004 | Igarashi et al. ......... | 428/690 |
| 7,238,437 | B2 | 7/2007 | Igarashi et al. ......... | 428/690 |
| 2001/0040296 | A1 | 11/2001 | Hiiromatsu ............. | 257/774 |
| 2007/0231602 | A1 | 10/2007 | Igarashi et al. ......... | 428/690 |
| 2009/0261711 | A1* | 10/2009 | Ito et al. .............. | 313/504 |

FOREIGN PATENT DOCUMENTS

| | | |
|---|---|---|
| EP | 1 211 257 A2 | 5/2002 |
| JP | 2000-33561 | 2/2000 |
| JP | 2001-33684 | 2/2001 |
| JP | 2001-189539 | 7/2001 |
| JP | 2001-219909 | 8/2001 |
| JP | 2001-239281 | 9/2001 |
| JP | 2001-247859 | 9/2001 |
| JP | 2001-248165 | 9/2001 |
| JP | 2001-298470 | 10/2001 |
| JP | 2002-173674 | 6/2002 |
| JP | 2002-203678 | 7/2002 |
| JP | 2002-203679 | 7/2002 |
| JP | 2002-226495 | 8/2002 |
| JP | 2002-234894 | 8/2002 |
| WO | WO 00/57676 | 9/2000 |
| WO | WO 00/70655 | 11/2000 |

(Continued)

OTHER PUBLICATIONS

Ding et al., Synthetic Metals, (2006), vol. 156(2-4), pp. 110-116.*

(Continued)

*Primary Examiner* — Dawn L Garrett
(74) *Attorney, Agent, or Firm* — Fitzpatrick, Cella, Harper & Scinto

(57) ABSTRACT

Provided is an organic electroluminescent device that brings together a high efficiency, high durability, and a high color purity. The organic electroluminescent device includes an anode, a cathode, and a layer including an organic compound interposed between the anode and the cathode, in which the layer contains at least one organic germanium compound having two or more fluorenyl groups per one germanium atom.

6 Claims, 3 Drawing Sheets

FOREIGN PATENT DOCUMENTS

| | | |
|---|---|---|
| WO | WO 01/08230 A1 | 2/2001 |
| WO | WO 01/39234 A2 | 5/2001 |
| WO | WO 01/41512 A1 | 6/2001 |
| WO | WO 02/02714 A2 | 1/2002 |
| WO | WO 02/15645 A1 | 2/2002 |
| WO | WO 2007/032161 A * | 3/2007 |

OTHER PUBLICATIONS

Baldo, et al., "Highly Efficient Phosphorescent emission from Organic Electroluminescent Devices," Letters to Nature, *Nature*, vol. 395, 151-154 (1998).

Djurovich et al., "Ir (III) Cyclometalated Complexes as Efficient Phosphorescent Emitters in Polymer Blend and Organic LEDs," *Polymer Preprints*, vol. 41, No. 1, 770-771 (2000).

Lamansky et al., "Highly Phosphorescent Bis-Cyclometalated Iridium Complexes: Synthesis, Photophysical Characterization, and Use in Organic Light Emitting Diodes," *J. Am. Chem. Soc.*, vol. 123, 4303-4312 (2001).

Adachi et al., "Endothermic Energy Transfer: A Mechanism for Generating Very Efficient High-Energy Phosphorescent Emission in Organic Materials," *Applied Physics Letters*, vol. 79, No. 13 (2001).

Balzani et al., "On the Orbital Nature of the Luminescent Excited State of Orthometalated Transition Metal Complexes," Photochemistry and Photophysics of Coordination Compounds, Proceedings of the Seventh International Symposium on the Photochemistry and Photophysics of Coordination Compounds Elmau/FRG, Mar. 29-Apr. 2, 1987, pp. 71-77.

Craig et al., "Synthesis and Photophysical Studies of Ortho-Metalated Pd(II) Complexes Including Two Novel Pd(II)/Rh(III) Dimers," Proceedings of the Seventh International Symposium on the Photochemistry and Photophysics of Coordination Compounds Elmau/FRG, Mar. 29-Apr. 2, 1987, pp. 135-146.

Birkofer et al., "General Synthetic Pathways to Organosilicon Compounds," The Chemistry of Organic Silicon Compounds, An Interscience Publication, pp. 655-761, 1989.

Chen et al, "Recent Developments in Molecular Organic Electroluminescent Materials," *Macrimol. Symp.*, vol. 125, 1-48 (1997).

O'Brien et al., "Improved Energy Transfer in Electrophosphorescent Devices," *Applied Physics Letters*, vol. 74, No. 3, 442-444 (1999).

Baldo et al., "Very High-Efficiency Green Organic Light-Emitting Devices Based on Electrophosphorescence," *Applied Physics Letters*, vol. 75, No. 1, 4-6 (1999).

Burroughes et al., "Light-Emitting Diodes Based on Conjugated Polymers," *Nature*, vol. 347, 539-541 (1997).

Vincett et al., "Electrical Conduction and Low Voltage Blue Electroluminescence in Vacuum-Deposited Organic Films," *Thin Solid Films*, vol. 94, 171-183 (1982).

Inouye et al., "Observation of Feshbach Resonances in a Bose-Einstein Condensate," *Nature*, vol. 392, 151-154 (1998).

* cited by examiner

ORGANIC ELECTROLUMINESCENT DEVICE

BACKGROUND OF THE INVENTION

1. Field of the Invention

The present invention relates to an organic electroluminescent device.

2. Description of the Related Art

An old-style organic electroluminescent device has been caused to emit light by, for example, applying a voltage to an anthracene deposited film (Thin Solid Films, 94, 171 (1982)). Since, for example, the fact that an organic electroluminescent device can be driven at a low voltage and the fact that the device is superior in response speed to a liquid crystal display (LCD) have been revealed in recent years, the device has been expected to provide practical use in, for example, displays, and the development of a material for the device with a view to putting the device into practical use has been vigorously conducted.

Here, as detailed in Macromol. Symp. 125, 1 to 48 (1997), the structure of the organic electroluminescent device is generally such that two electrodes, that is, upper and lower electrodes and layers each formed of an organic compound, the layers being interposed between the electrodes and the layers including a light-emitting layer, are formed on a transparent substrate.

By the way, a technology for causing the organic electroluminescent device to emit light conventionally adopted is as follows: fluorescence upon transition from a singlet exciton to a ground state is utilized as a light emission output. Not only fluorescence but also phosphorescence upon transition from a triplet exciton to a ground state as disclosed in each of Improved energy transfer in electrophosphorescent device (D. F. O'Brien et al., Applied Physics Letters Vol. 74, No. 3, p. 422 (1999)) and Very high-efficiency green organic light-emitting devices based on electrophosphorescence (M. A. Baldo et al., Applied Physics Letters Vol. 75, No. 1, p. 4 (1999)) has been recently utilized as a light emission output. In addition, each of Improved energy transfer in electrophosphorescent device (D. F. O'Brien et al., Applied Physics Letters Vol. 74, No. 3, p. 422 (1999)) and Very high-efficiency green organic light-emitting devices based on electrophosphorescence (M. A. Baldo et al., Applied Physics Letters Vol. 75, No. 1, p. 4 (1999)) proposes an organic electroluminescent device having a four-layered constitution (formed of a hole-transporting layer, a light-emitting layer, an exciton diffusion-prevention layer, and an electron-transporting layer). An improvement in the efficiency of the organic electroluminescent device is achieved by using a green phosphorescent material $Ir(ppy)_3$ as a light-emitting material contained in the light-emitting layer.

Meanwhile, in addition to such organic electroluminescent device using a low-molecular-weight material as described above, an organic electroluminescent device using a conjugated polymer has been reported by a group in the University of Cambridge (Nature, 347, 539 (1990)). The report proposes a device that emits light by using a single layer formed of polyphenylene vinylene (PPV) by an application method (Wet process). Here, the advantages of the production of an organic electroluminescent device by the application method are, for example, as follows: the application method is a simple method for film formation as compared to, for example, a deposition method, and eliminates the needs for a shadow mask for separately coating coloring materials and a vacuum apparatus. The application method is a promising method of producing an organic electroluminescent device because of those advantages.

As described above, a technique for producing an organic electroluminescent device has recently shown significant progress. However, the device produced by the technology still requires an optical output with a higher luminance or higher conversion efficiency in order that the device may be put into practical use, so that a technology for producing a device that brings together high durability and high color purity has been demanded. In particular, as far as organic electroluminescent devices for emitting green light or blue light are concerned, the reality is as follows: the number of devices at practical levels each of which brings together a high efficiency, high durability, and a high color purity has been still small. In addition, as far as only a device corresponding to the application method is concerned, it is difficult even to procure a material for producing such device at a practical level.

A blue phosphorescent device having a high efficiency has been recently proposed in Applied Physics Letters, 83, 3, 818 (2003). Applied Physics Letters, 83, 3, 818 (2003) discloses, as a host material to be used in a light-emitting layer, a Si-containing compound formed of UGH1 and UGH2. However, the Si-containing compound disclosed in the document is limited to one having a simple structure substituted with a phenyl group, and the material itself has high crystallinity. Accordingly, the use of the compound as a component for an organic electroluminescent device is apt to cause the crystallization at the time of the driving of the device or due to the long-term storage. In addition, the Si-containing compound shows so poor solubility in any one of various solvents that it is difficult to produce a device from the compound by employing the application method.

As described above, as long as attention is paid only to an improvement in the efficiency, several organic electroluminescent devices at practical levels have been reported, but a hurdle which those who wish to obtain an organic electroluminescent device that brings together high durability and a high color purity as well as a high efficiency must overcome is high.

SUMMARY OF THE INVENTION

It is, therefore, an object of the present invention to provide an organic electroluminescent device that brings together a high efficiency, high durability, and high color purity.

The above problems can be solved by an organic electroluminescent device of the present invention which is described later. Here, the organic electroluminescent device of the present invention includes: an anode; a cathode; and a layer including an organic compound interposed between the anode and the cathode, in which the layer contains at least one kind of an organic germanium compound having two or more fluorenyl groups per one germanium atom.

According to the present invention, there can be provided an organic electroluminescent device at a practical level that brings together a high efficiency, high durability, and high color purity. In particular, the organic germanium compound contained in the organic electroluminescent device of the present invention is a material which exerts an excellent host function with respect to a fluorescent or phosphorescent light-emitting material, and embodies an organic electroluminescent device that brings together high efficiency, high durability, and high color purity.

DESCRIPTION OF THE EMBODIMENTS

Hereinafter, the present invention will be described in detail.

An organic electroluminescent device of the present invention includes an anode, a cathode, and a layer including an organic compound interposed between the anode and the cathode.

Hereinafter, the organic electroluminescent device of the present invention will be described in detail with reference to the drawings.

First, reference symbols will be described.

Reference symbols 1a, 1b, 1c, and 34 each denote an organic electroluminescent device; 10, a metal electrode; 11, an electron injecting/transporting layer; 12, a light-emitting layer; 13, a hole injecting/transporting layer; 14, a transparent electrode; 15, a transparent substrate; 16, an interlayer; 17, a multifunctional light-emitting layer; 20 and 40, display apparatuses; 21, a scanning signal driver; 22, an information signal driver; 23, a current supply source; 24 and 30, pixel circuits; 31, a first thin film transistor (TFT); 32, a capacitor ($C_{add}$); 33, a second thin film transistor (TFT); 41, a substrate; 42, a moisture resistant layer; 43, a gate electrode; 44, a gate insulating film; 45, a semiconductor film; 46, a drain electrode; 47, a source electrode; 48, a TFT element; 49, an insulating film; 50, a contact hole (through-hole); 51, an anode; 52, an organic layer; 53, a cathode; 54, a first protective layer; and 55, a second protective layer.

Figure 1A:
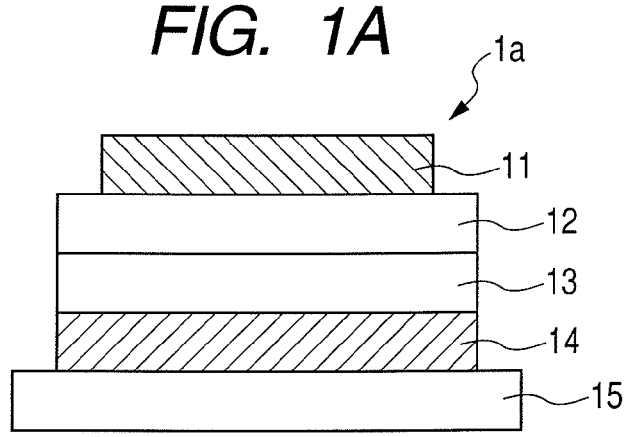
FIGS. 1A, 1B, and 1C are each a cross-sectional view illustrating an example of an embodiment of an organic electroluminescent device of the present invention, FIG. 1A being a cross-sectional view illustrating a first embodiment, FIG. 1B being a cross-sectional view illustrating a second embodiment, and FIG. 1C being a cross-sectional view illustrating a third embodiment.
Figure 1B:
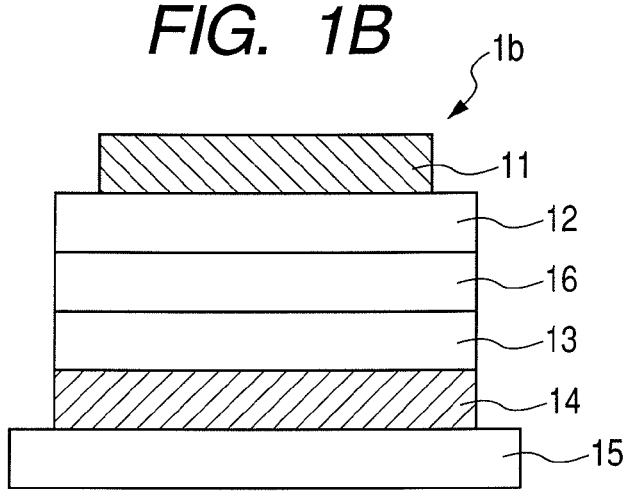
Figure 1C:
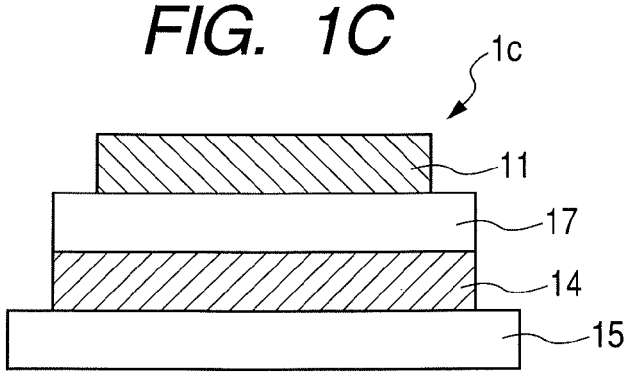

FIGS. 1A, 1B, and 1C are each a cross-sectional view illustrating an example of an embodiment in the organic electroluminescent device of the present invention, FIG. 1A being a cross-sectional view illustrating a first embodiment, FIG. 1B being a cross-sectional view illustrating a second embodiment, and FIG. 1C being a cross-sectional view illustrating a third embodiment.

The organic electroluminescent device 1a shown in FIG. 1A is formed by providing, on the transparent substrate 15, a stack in which the metal electrode 11, the light-emitting layer 12, the hole injecting/transporting layer 13, and the transparent electrode 14 are stacked in the mentioned order from above. Here, the light-emitting layer 12 and the hole injecting/transporting layer 13 are each constituted of an organic compound.

The organic electroluminescent device 1a shown in FIG. 1A exhibits electrical rectifying property. When an electric field is applied to the organic electroluminescent device 1a such that the metal electrode 11 serves as a cathode and the transparent electrode 14 serves as an anode, electrons are injected from the metal electrode 11 into the light-emitting layer 12, and holes are injected from the transparent electrode 14 into the light-emitting layer 12. The injected holes and the injected electrons recombine with each other in the light-emitting layer 12 to produce excitons. The organic electroluminescent device 1a emits light when the excitons return to a ground state. At that time, the hole injecting/transporting layer 13 serves also as an electron blocking layer. As a result, the recombination efficiency of the holes and electrons at an interface between the light-emitting layer 12 and the hole injecting/transporting layer 13 is improved, so that the emission efficiency is improved.

The organic electroluminescent device 1b shown in FIG. 1B differs from the organic electroluminescent device 1a shown in FIG. 1A in that the interlayer 16 is provided between the light-emitting layer 12 and the hole injecting/transporting layer 13.

The interlayer 16 exerts not only an effect of more efficiently blocking electrons but also an effect of blocking ions leaking out from the transparent electrode 14 or the hole injecting/transporting layer 13. Accordingly, providing the interlayer 16 improves not only the emission efficiency of the organic electroluminescent device but also the durability of the device.

The organic electroluminescent device 1c shown in FIG. 1C is formed by providing, on the transparent substrate 15, a stack in which the metal electrode 11, the multifunctional light-emitting layer 17, and the transparent electrode 14 are stacked in the mentioned order from above. As indicated by the organic electroluminescent device 1c shown in FIG. 1C, the organic electroluminescent device of the present invention may have only one layer including an organic compound interposed between the electrodes. However, in this embodiment, a host or guest that constitutes the multifunctional light-emitting layer 17 must be a multifunctional material having one of high carrier injection ability and high carrier transportability. Therefore, in the case of a device constitution indicated by the organic electroluminescent device 1c shown in FIG. 1C, an organic germanium compound to be described later is preferably used.

The organic electroluminescent device of the present invention is of course not limited to the embodiments shown in FIGS. 1A, 1B, and 1C. For example, an electron blocking layer, a hole blocking layer, an electron-transporting layer, or an electron injection layer can be provided so as to interpose it between the electrodes.

The organic electroluminescent device of the present invention contains, in the layer including an organic compound, at least one kind of an organic germanium compound having two or more fluorenyl groups per one germanium atom. The term "layer including an organic compound" as herein employed specifically refers to each of the light-emitting layer 12, the hole injecting/transporting layer 13, the interlayer 16, and the multifunctional light-emitting layer 17 shown in FIGS. 1A to 1C. The organic germanium compound is preferably incorporated into the light-emitting layer 12 or the multifunctional light-emitting layer 17.

Next, the organic germanium compound will be described in detail. The organic germanium compound to be incorporated into the layer including an organic compound is a compound having two or more fluorenyl groups per one germanium atom. The term "fluorenyl group" as herein employed is not limited to a fluorenyl group and is intended to also encompass a fused polycyclic aromatic group containing fluorenyl skeleton(s).

Specific examples of the fused polycyclic aromatic group containing a fluorenyl skeleton include fused polycyclic aromatic groups represented by the following formulae. Each of the groups may be bonded to a germanium atom at any position. However, the present invention is of course not limited to these examples.

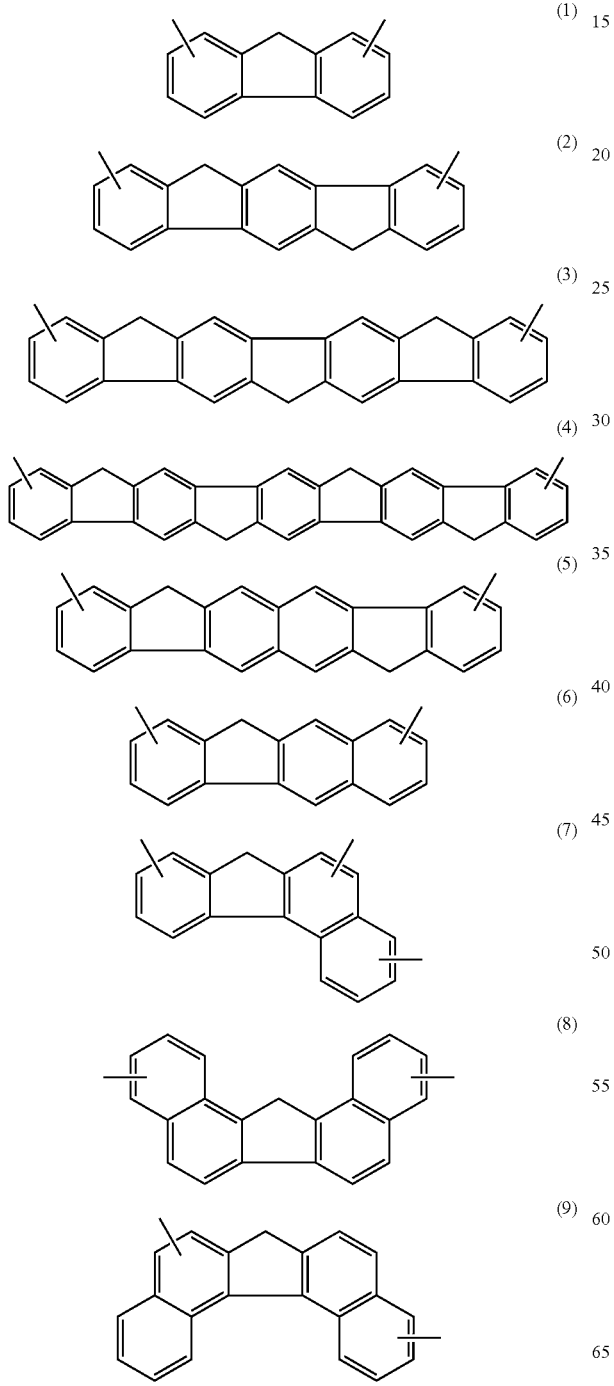

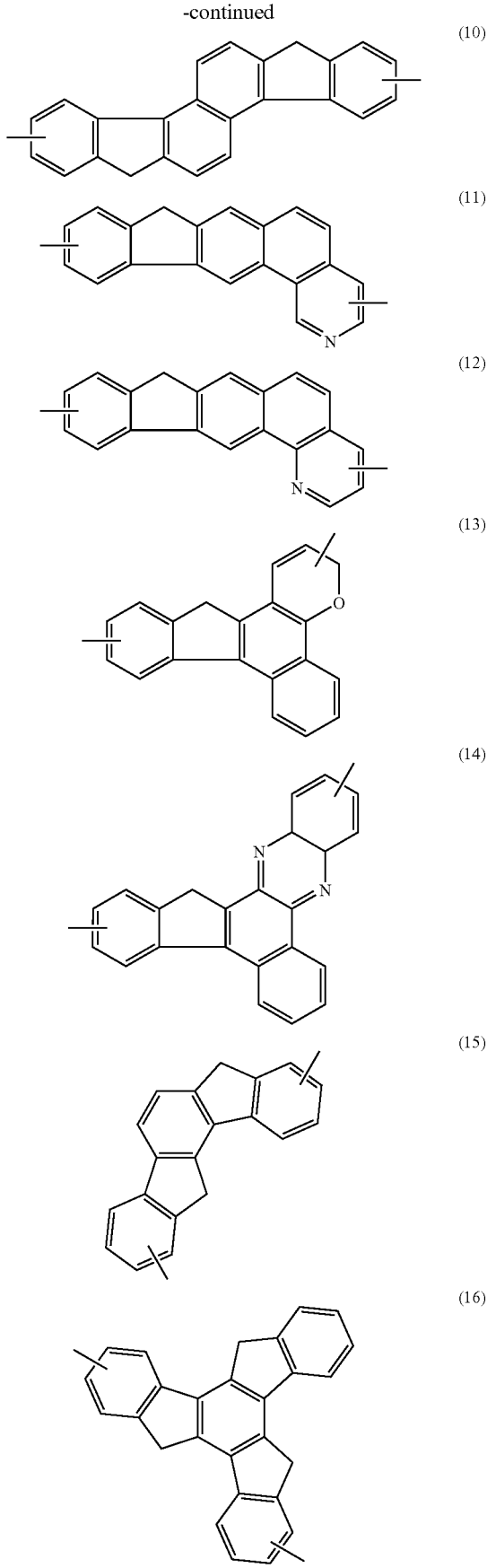

(17)

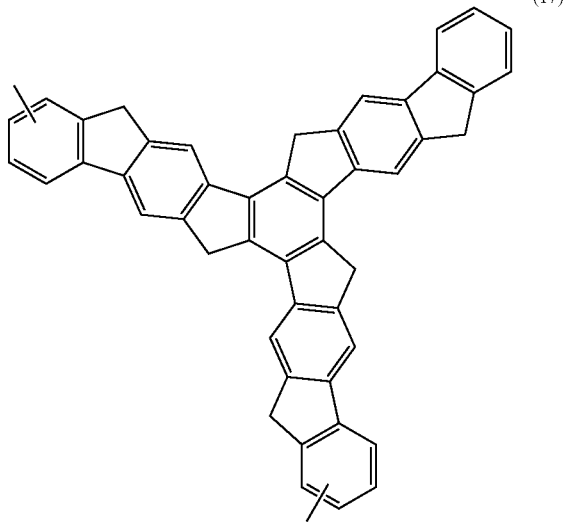

(18)

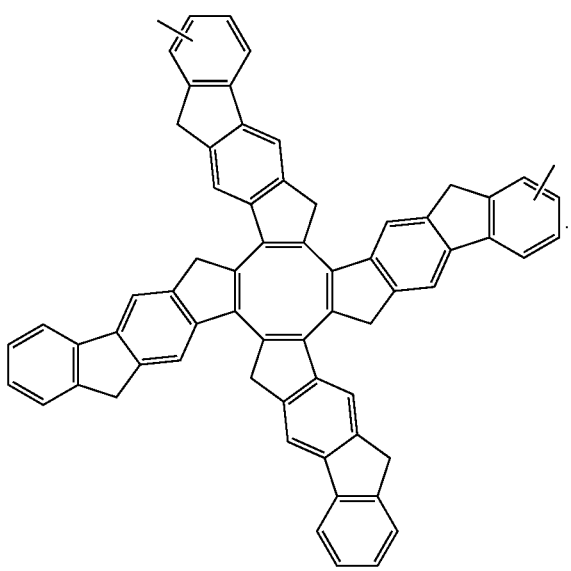

Each of the fused polycyclic aromatic groups represented by the above formulae may be substituted with: an alkyl group such as an ethyl group, an n-propyl group, a tert-butyl group, an iso-pentyl group, or an n-hexyl group; or an aryl group such as a 2,4,6-trimethylphenyl group, a biphenyl group, or a 4-(2,7-di-tert-butyl-9,9-dimethyl-9H)fluorenyl group.

Next, a suitable example of the organic germanium compound to be incorporated into the layer including an organic compound will be described. A first suitable example is a compound represented by the following general formula [1].

[1]

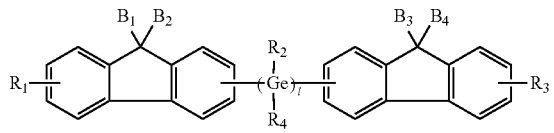

In the formula [1], $R_1$, $R_{12}$, $R_3$, and $R_4$ each represent, independently of one another, a substituted or unsubstituted phenyl group, a substituted or unsubstituted biphenyl group, a substituted or unsubstituted terphenyl group, a substituted or unsubstituted naphthalenyl group, or a substituted or unsubstituted fluorenyl group.

Examples of the substituent that the phenyl group, biphenyl group, terphenyl group, naphthalenyl group, and fluorenyl group may have include alkyl groups (having carbon atom(s) of preferably 1 to 30, more preferably 1 to 20, and particularly preferably 1 to 10, and for example, a methyl group, an ethyl group, an iso-propyl group, a tert-butyl group, an n-octyl group, an n-decyl group, an n-hexadecyl group, a cyclopropyl group, a cyclopentyl group, and a cyclohexyl group are mentioned), alkenyl groups (having carbon atoms of preferably 2 to 30, more preferably 2 to 20, and particularly preferably 2 to 10, and for example, a vinyl group, an allyl group, a 2-butenyl group, and a 3-pentenyl group are mentioned), alkynyl groups (having carbon atoms of preferably 2 to 30, more preferably 2 to 20, and particularly preferably 2 to 10, and for example, a propargyl group and a 3-pentynyl group are mentioned), aryl groups (having carbon atoms of preferably 6 to 30, more preferably 6 to 20, and particularly preferably 6 to 12, and for example, a phenyl group, a p-methylphenyl group, a naphthyl group, an anthryl group, and a fluorenyl group are mentioned), amino groups (having carbon atom(s) of preferably 0 to 30, more preferably 0 to 20, and particularly preferably 0 to 10, and for example, an amino group, a methylamino group, a dimethylamino group, a diethylamino group, a dibenzylamino group, a diphenylamino group, and a ditolylamino group are mentioned), alkoxyl groups (having carbon atom(s) of preferably 1 to 30, more preferably 1 to 20, and particularly preferably 1 to 10, and for example, a methoxy group, an ethoxy group, a butoxy group, and a 2-ethylhexyloxy group are mentioned), aryloxy groups (having carbon atoms of preferably 6 to 30, more preferably 6 to 20, and particularly preferably 6 to 12, and for example, a phenyloxy group, a 1-naphthyloxy group, and a 2-naphthyloxy group are mentioned), a heteroaryloxy groups (having carbon atom(s) of preferably 1 to 30, more preferably 1 to 20, and particularly preferably 1 to 12, and for example, a pyridyloxy group, a pyradyloxy group, a pyrimidyloxy group, and a quinolyloxy group are mentioned), acyl groups (having carbon atom(s) of preferably 1 to 30, more preferably 1 to 20, and particularly preferably 1 to 12, and for example, an acetyl group, a benzoyl group, a formyl group, and a pivaloyl group are mentioned), alkoxycarbonyl groups (having carbon atoms of preferably 2 to 30, more preferably 2 to 20, and particularly preferably 2 to 12, and for example, a methoxycarbonyl group and an ethoxycarbonyl group are mentioned), aryloxycarbonyl groups (having carbon atoms of preferably 7 to 30, more preferably 7 to 20, and particularly preferably 7 to 12, and for example, a phenyloxycarbonyl group is mentioned), acyloxy groups (having carbon atoms of preferably 2 to 30, more preferably 2 to 20, and particularly preferably 2 to 10, and for example, an acetoxy group and a benzoyloxy group are mentioned), acylamino groups (having carbon atoms of preferably 2 to 30, more preferably 2 to 20, and particularly preferably 2 to 10, and for example, an acetylamino group and a benzoylamino group are mentioned), alkoxycarbonylamino groups (having carbon atoms of preferably 2 to 30, more preferably 2 to 20, and particularly preferably 2 to 12, and for example, a methoxycarbonylamino group is mentioned), aryloxycarbonylamino groups (having carbon atoms of preferably 7 to 30, more preferably 7 to 20, and particularly preferably 7 to 12, and for example, a phenyloxycarbonylamino group is mentioned), sulfonylamino groups (having carbon atom(s) of preferably 1 to 30, more preferably 1 to 20, and particularly preferably 1 to 12, and for example, a methanesulfonylamino group and a benzenesulfonylamino group are mentioned), sulfamoyl groups (having carbon atom(s) of preferably 0 to 30, more preferably 0 to 20, and particularly preferably 0 to 12, and for example, a sulfamoyl group, a methylsulfamoyl group, a dimethylsulfamoyl group, and a phenylsulfamoyl group are mentioned), carbamoyl groups (having carbon atom(s) of preferably 1 to 30, more preferably 1 to 20, and particularly preferably 1 to 12, and for example, a carbamoyl group, a methylcarbamoyl group, a diethylcarbamoyl group, and a phenylcarbamoyl group are mentioned), alkylthio groups (having carbon atom(s) of preferably 1 to 30, more preferably 1 to 20, and particularly preferably 1 to 12, and for example, a methylthio group and an ethylthio group are mentioned), arylthio groups (having carbon atoms of preferably 6 to 30, more preferably 6 to 20, and particularly preferably 6 to 12, and for example, a phenylthio group is mentioned), heteroarylthio groups (having carbon atom(s) of preferably 1 to 30, more preferably 1 to 20, and particularly preferably 1 to 12, and for example, a pyridylthio group, a 2-benzimizolylthio group, a 2-benzoxazolylthio group, and a 2-benzthiazolylthio group are mentioned), sulfonyl groups (having carbon atom(s) of preferably 1 to 30, more preferably 1 to 20, and particularly preferably 1 to 12, and for example, a mesyl group and a tosyl group are mentioned), sulfinyl groups (having carbon atom(s) of preferably 1 to 30, more preferably 1 to 20, and particularly preferably 1 to 12, and for example, a methanesulfinyl group, and a benzenesulfinyl group are mentioned), an ureide groups (having carbon atom(s) of preferably 1 to 30, more preferably 1 to 20, and particularly preferably 1 to 12, and for example, an ureide group, a methylureide group, and a phenylureide group are mentioned), phosphoric acid amide groups (having carbon atom(s) of preferably 1 to 30, more preferably 1 to 20, and particularly preferably 1 to 12, and for example, a diethyl phosphoric acid amide group and a phenyl phosphoric acid amide group are mentioned), a hydroxyl group, a mercapto group, halogen atoms (for example, a fluorine atom, a chlorine atom, a bromine atom, and a iodine atom), a cyano group, a sulfo group, a carboxyl group, a nitro group, a hydroxamic acid group, a sulfino group, a hydrazino group, an imino group, a heterocyclic group, (having carbon atom(s) of preferably 1 to 30 and more preferably 1 to 12, and for example, a nitrogen atom, an oxygen atom, and an sulfur atom are mentioned as a hetero atom, and specifically, an imidazolyl group, a pyridyl group, a quinolyl group, a furyl group, a thienyl group, a piperidyl group, a morpholino group, a benzoxazolyl group, a benzimidazolyl group, a benzthiazolyl group, a carbazolyl group, and an azepinyl group are mentioned), silyl groups (having carbon atoms of preferably 3 to 40, more preferably 3 to 30, and particularly preferably 3 to 24, and for example, trimethyl silyl group and a triphenyl silyl group are mentioned), and germyl groups (having carbon atoms of preferably 3 to 40, more preferably 3 to 30, and particularly preferably 3 to 24, and for example, a trimethylgermyl group and triphenylgermyl group are mentioned).

In the formula [1], $B_1$, $B_2$, $B_3$, and $B_4$ each represent, independently of one another, a linear or branched alkyl group having 1 to 20 carbon atoms, a substituent having an aromatic amine group, or a substituent having an aromatic borane group.

Examples of the linear or branched alkyl group having 1 to 20 carbon atoms represented by any one of $B_1$ to $B_4$ include a methyl group, an ethyl group, an n-propyl group, an isopropyl group, an n-butyl group, a tert-butyl group, an isopentyl group, a 2-ethylpentyl group, an n-hexyl group, an n-heptyl group, an n-octyl group, a 3,7-dimethyloctyl group, an n-decyl group, and an n-hexadecyl group.

When the alkyl group represented by any one of $B_1$ to $B_4$ has 2 or more carbon atoms, one or more non-adjacent methylene groups may each be substituted with a divalent aromatic group or a divalent heterocyclic group.

The term "divalent aromatic group" herein employed refers to a substituted or unsubstituted, monocyclic or fused ring having two bonding positions, though the bonding positions are not particularly limited. Specific examples of the monocyclic or fused ring used herein include a benzene ring, a naphthalene ring, an anthracene ring, a phenanthrene ring, a fluorene ring, an acenaphthalene ring, an azulene ring, a heptacene ring, a heptaphene ring, an aceanthrylene ring, a pyrene ring, a perylene ring, a triphenylene ring, an pentacen ring, a coronene ring, a hexaphene ring, and a chrysene ring.

All or part of the hydrogen atoms of each of those aromatic rings may be substituted with fluorine. Alternatively, multiple rings may be boned via a single bond to form a composite substituent, or may be bonded via a linking group which is di- or more valent and which is constituted of, for example, a carbon atom, a nitrogen atom, an oxygen atom, or a sulfur atom to form a composite substituent. Specific examples of the substituent which the divalent aromatic group may have are the same as the specific examples of the substituent which each of the phenyl group, the biphenyl group, the terphenyl group, the naphthalenyl group, and the fluorenyl group each represented by any one of $R_1$ to $R_4$ may have.

The term "divalent heterocyclic group" herein employed refers to a substituted or unsubstituted heterocyclic ring having two bonding positions, though the bonding positions are not particularly limited. Specific examples of the heterocyclic ring used herein include a furan ring, a thiophene ring, a pyrrole ring, a pyrroline ring, a pyrrolidine ring, an oxazole ring, an isoxazol ring, a thiazole ring, an isothiazole ring, an imidazole ring, an imidazoline ring, an imidazolidine ring, a pyrazole ring, a pyrazolidine ring, a furazan ring, a pyrane ring, a pyrene ring, a pyridine ring, a piperidine ring, a pyridazine ring, a pyrimidine ring, a pyrazine ring, a piperazine ring, a morpholine ring, an indole ring, an indoline ring, an indazole ring, a chromene ring, a chroman ring, an isochroman ring, a quinoline ring, an isoquinoline ring, a cinnoline ring, a phthalazine ring, a quinazoline ring, a quinoxaline ring, a naphthyridine ring, a purine ring, a pteridine ring, a carbazole ring, an acridine ring, phenanthroline, phenoxazine, a thianthrene group, or a xanthene ring.

All or part of the hydrogen atoms present in each of the substituents of those heterocyclic rings may be substituted with fluorine. Alternatively, multiple rings may be boned via a single bond to form a composite substituent, or may be bonded via a linking group which is di- or more valent and which is formed of, for example, a carbon atom, a nitrogen atom, an oxygen atom, or a sulfur atom to form a composite substituent. Specific examples of the substituent which the divalent heterocyclic group may have are the same as the specific examples of the substituent which each of the phenyl group, the biphenyl group, the terphenyl group, the naphthalenyl group, and the fluorenyl group each represented by any one of $R_1$ to $R_4$ may have.

In addition, hydrogen atom(s) in a substituent of the alkyl group represented by any one of $B_1$ to $B_4$ may be substituted with fluorine atom(s).

Specific examples of the alkyl group represented by any one of $B_1$ to $B_4$ are shown below. However, the present invention is not limited to these examples.

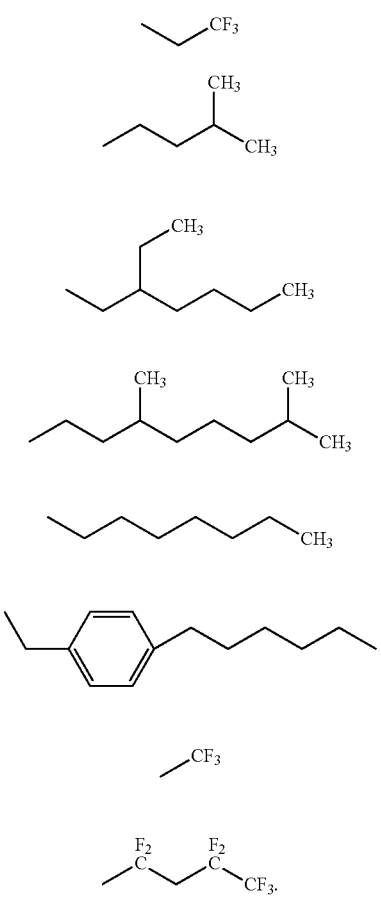

(19)
(20)
(21)
(22)
(23)
(24)
(25)
(26)

In a substituent having an aromatic amine group represented by $B_1$ to $B_4$, specific examples of the aromatic amine include triphenylamine, trimesitylamine, tri(o-biphenyl) amine, tri(m-biphenyl)amine, tri(p-biphenyl)amine, tri(1-naphthyl)amine, tri(2-naphthyl)amine, tri(anthryl)amine, tri (thienyl)amine, tri(furyl)amine, tri(fluorenyl)amine, tri(9,9-diethylfluorenyl)amine, tri(terphenyl)amine, fluorenyldiphenylamine, difluorenylphenylamine, and biphenyldiphenylamine, but the present invention is not limited thereto.

In a substituent having an aromatic borane group represented by $B_1$ to $B_4$, specific examples of the aromatic borane include triphenylborane, trimesitylborane, tri(o-biphenyl)borane, tri(m-biphenyl)borane, tri(p-bipheyl)borane, tri(1-naphthyl)borane, tri(2-naphthyl)borane, tri(anthryl)borane, tri(thienyl)borane, tri(furyl)borane, tri(fluorenyl)borane, tri (9,9-diethylfluorenyl)borane, tri(terphenyl)borane, naphthyldiphenyl borane, and di(biphenyl)phenylborane, but the present invention is not limited thereto.

The organic germanium compound into which the substituent having an aromatic amine group is introduced can be suitably used as a component for a layer having hole-transporting property (a hole injection layer, a hole-transporting layer, or an interlayer). On the other hand, the organic germanium compound into which the substituent having an aromatic borane group is introduced can be suitably used as a component for a layer having electron-transporting property (an electron-transporting layer or an electron injection layer). However, the organic germanium compound represented by the formula [1] can be used in, for example, an interlayer, an electron blocking layer, a light-emitting layer, or a hole blocking layer even when a substituent having an aromatic amine or aromatic borane and serving as a carrier transporting moiety is not introduced. This is because the organic germanium compound represented by the formula [1] has the characteristics such that a germanium atom has an empty d orbital, a fluorene residue shows bipolar property to flow both kinds of carriers, and the gap can be easily widened.

Specific examples of the substituent having an aromatic amine group and the substituent having an aromatic borane group each represented by any one of $B_1$ to $B_4$ include the following substituents. The present invention is of course not limited to these examples.

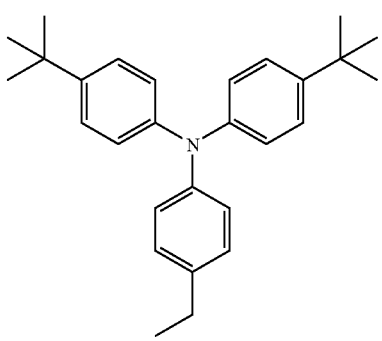

(27)

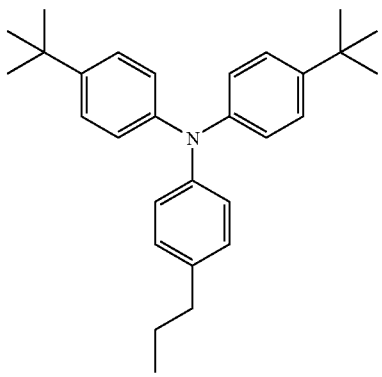

(28)

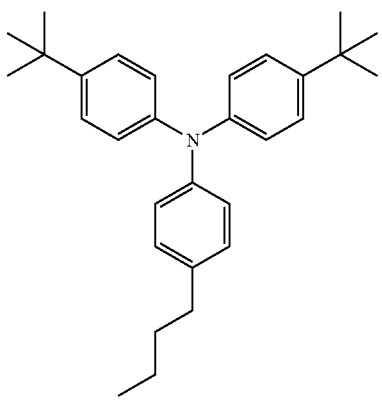

(29)

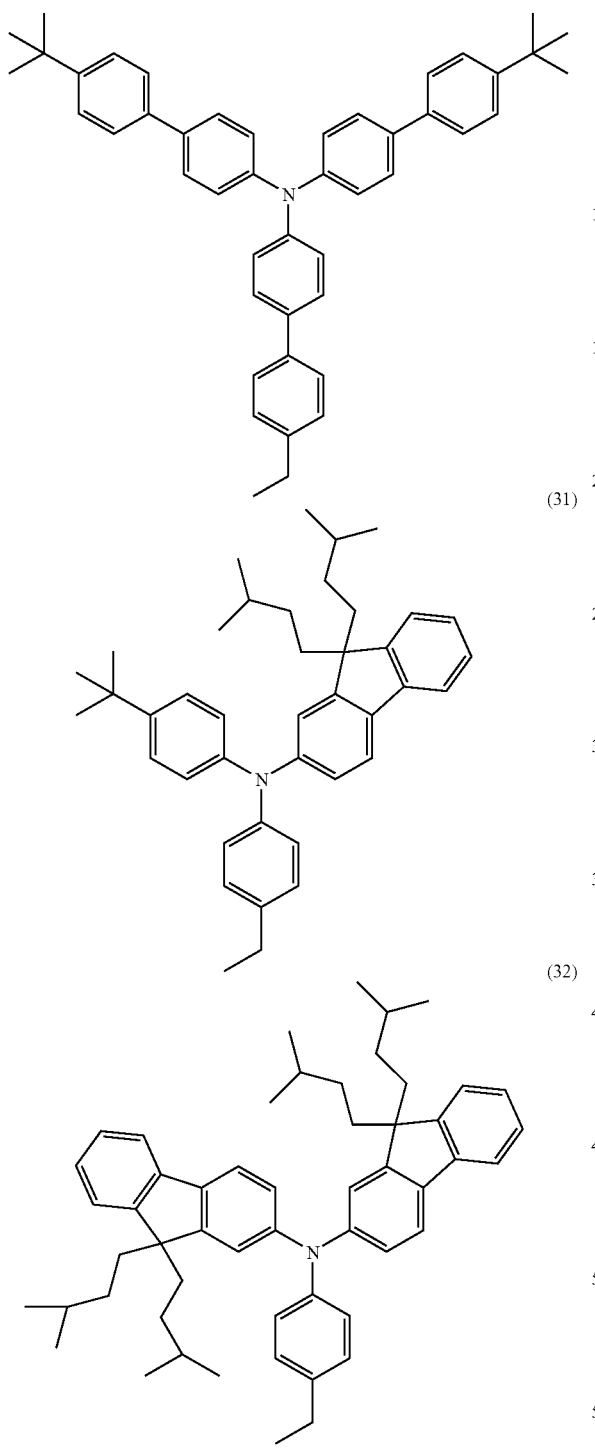
(30)
(31)
(32)
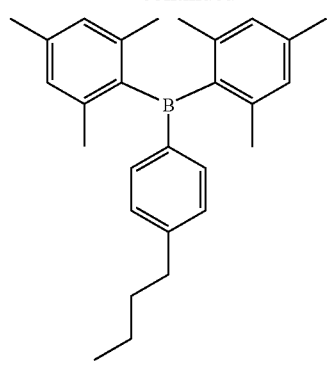
(33)
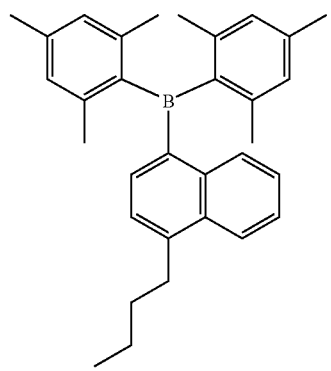
(34)
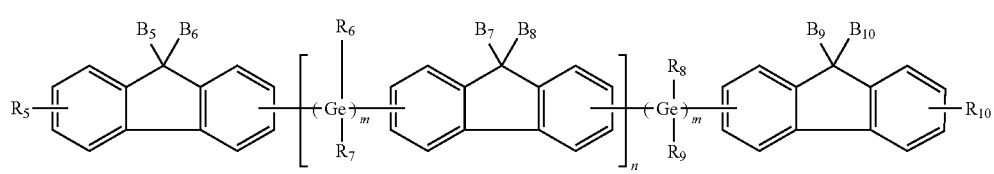
(35)
In the formula [1], l represents an integer of 1 to 4.
A second suitable example of the organic germanium compound is a compound represented by the following formula [2].
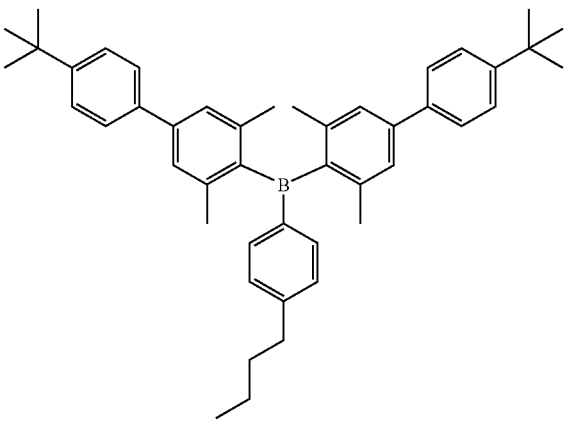
[2]

In the formula [2], $R_5$, $R_6$, $R_7$, $R_8$, $R_9$, and $R_{10}$ each represent, independently of one another, a substituted or unsubstituted phenyl group, a substituted or unsubstituted biphenyl group, a substituted or unsubstituted terphenyl group, a substituted or unsubstituted naphthalenyl group, or a substituted or unsubstituted fluorenyl group.

Specific examples of the substituent which each of the phenyl group, the biphenyl group, the terphenyl group, the naphthalenyl group, and the fluorenyl group may have are the same as the specific examples of the substituent which a substituent represented by any one of $R_1$ to $R_4$ in the general formula [1] may have.

In the formula [2], $B_5$, $B_6$, $B_7$, $B_8$, $B_9$, and $B_{10}$ each represent, independently of one another, a linear or branched alkyl group having 1 to 20 carbon atoms, a substituent having an aromatic amine group, or a substituent having an aromatic borane group.

Specific examples of the alkyl group, the substituent having an aromatic amine group, and the substituent having an aromatic borane group each represented by any one of $B_5$ to $B_{10}$ are the same as the specific examples of the substituents represented by $B_1$ to $B_4$ in the general formula [1].

In the formula [2], n represents an integer of 1 to 20.

In the formula [2], m represents an integer of 1 to 4.

A method of producing the organic germanium compound represented by the general formula [1] or the general formula [2] will be described below. Such organic germanium compound can be synthesized by utilizing any one of various known carbon-germanium bond formation reactions, and the method for the synthesis is not particularly limited.

For example, the techniques described in The Chemistry of Organic Silicon Compounds, part 1, John Wiley & Sons, p. 655 to p. 761 (1989), Gmelin, Handbook of Inorganic and Organometallic Chemistry, Organogermanium Compounds, Part 3, 8th edition), Springer Berlin, p. 56 p. 133 (1990), and the like may be used for the synthesis. In addition, a reaction between an organic metal compound and a germanium halide compound can be used as a carbon-germanium bond formation reaction. In this case, for example, an organic magnesium compound or an organic lithium compound can be selected as the organic metal compound. In addition, for example, an organic germanium dichloride compound can be selected as the germanium halide compound.

The organic germanium compound represented by each of the general formula [1] and the general formula [2] has the following characteristics when used as a component for an organic electroluminescent device:

(i) When the compound is evaporated to form a film, the film shows so high amorphous property that the whitening (crystallization, coagulation, or the like) of the film does not occur even in the case where the film is stored for a long period of time or stored with heating.

(ii) The compound shows excellent solubility in various solvents and has high adaptability to a Wet process (application method or the like).

(iii) Since direct bonding between the germanium atom and a fluorenyl group results in occurrence of conjugation via the d orbital of a germanium atom, the compound has a high carrier transporting ability.

(iv) Since fluorene rings are not directly bonded to each other, but are bonded to each other via a germanium atom, the conjugation of the fluorene rings is suppressed, whereby the control of the lowest excited triplet energy level ($T_1$) can be made possible and a material having a higher $T_1$ than that of a light emitting material (especially a phosphorescent) can be obtained.

(v) Since a germanium atom has a larger atomic weight than those of C and Si as elements belonging to the same group in the periodic table, the atom has an effect of increasing the molecular weight or intermolecular force of a germanium compound, whereby a germanium compound having a high glass transition temperature can be obtained.

(vi) Unlike a carbon atom or a silicon atom as an element belonging to the same group in the periodic table, a germanium atom hardly undergoes ionization or oxidation, so that the stability of a compound itself is high.

The compound represented by the general formula [2] is an oligomer compound. Meanwhile, in general, a polymer compound does not have molecules with the same molecular weight but has a molecular weight distribution. Accordingly, it is difficult to purify the compound to increase the purity of the compound. As a result, the use of the polymer compound as a component for an organic electroluminescent device involves, for example, the problems such that an impurity is incorporated and a defect of a formed film is caused. Those problems are factors for impairing the durability of the organic electroluminescent device to a large extent. In contrast, the compound represented by the formula [2] is an oligomer compound, so that the compound has no molecular weight distribution, and it is easy to purify the compound to increase the purity of the compound. Therefore, the use of the oligomer compound represented by the formula [2] solves the problems inherent to the polymer compound such as the incorporation of an impurity and a defect in a formed film, thereby improving the durability of the organic electroluminescent device.

When it is desirable to use the above organic germanium compound as a component for a light-emitting layer and to allow the compound to function as a host for a phosphorescent light emitting material, it is preferable to control the lowest excited triplet energy level ($T_1$). For example, when it is desirable to emit high-color-purity green phosphorescent light having an emission peak at 490 nm to 520 nm, the $T_1$ of the organic germanium compound as a host is preferably set to 2.38 eV or more. In addition, when it is desirable to emit high-color-purity blue phosphorescent light having an emission peak at 430 nm to 450 nm, the $T_1$ is preferably set to 2.75 eV or more.

Specific examples of the organic germanium compound as a component for the organic electroluminescent device of the present invention are shown below. However, the present invention is of course not limited to these examples.

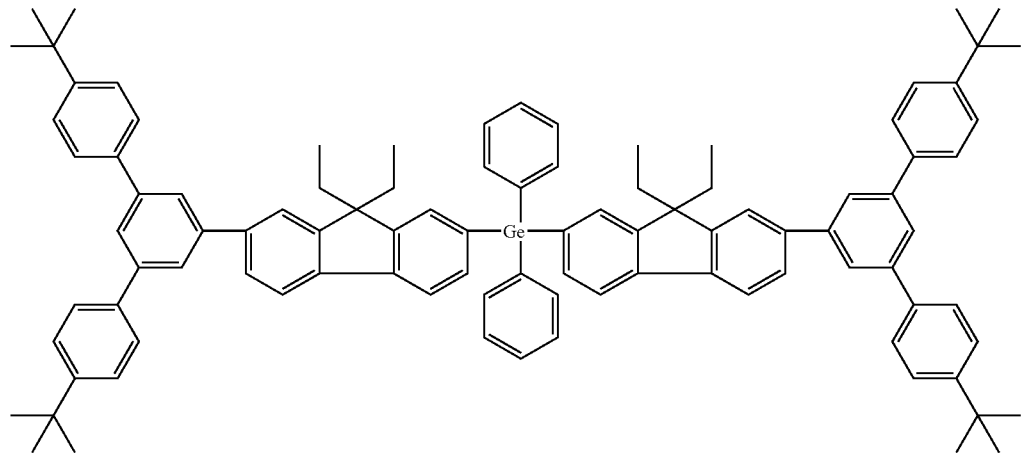
(36)
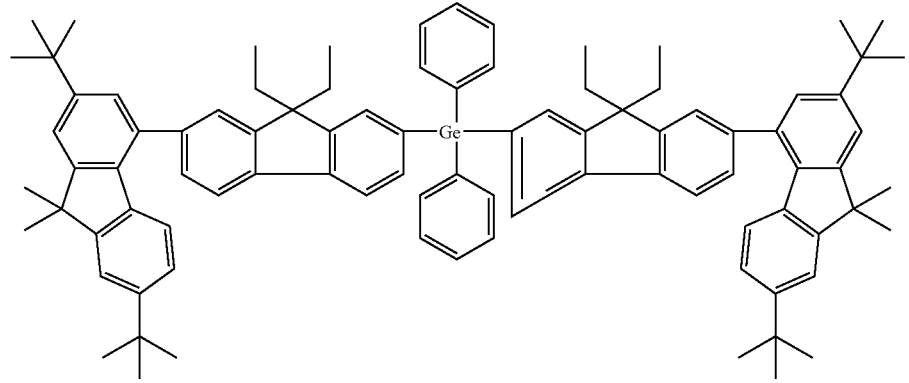
(37)
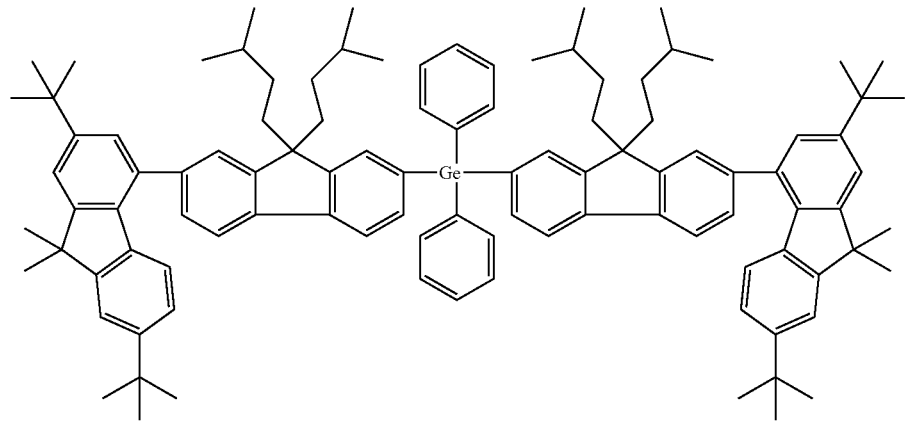
(38)
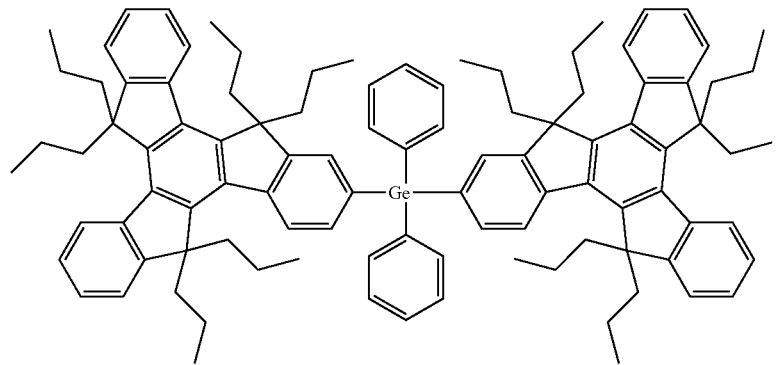
(39)

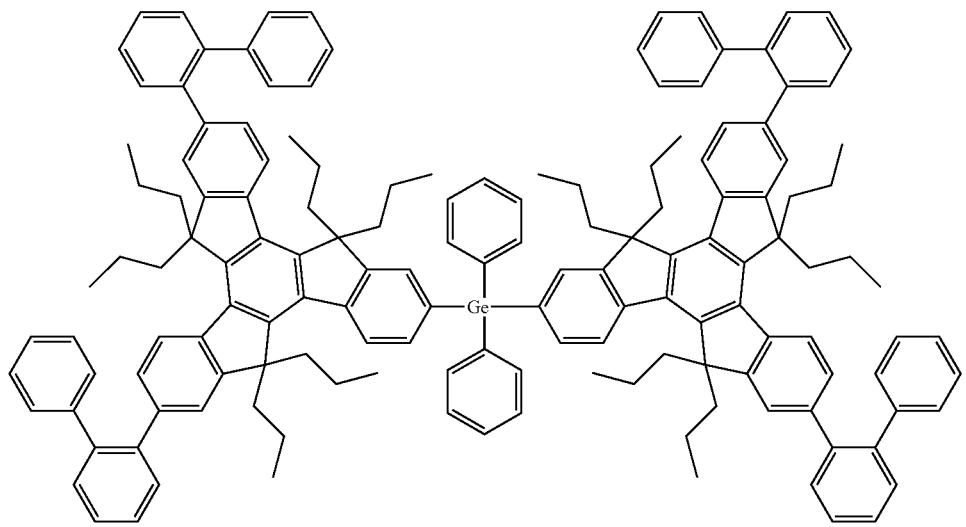
(40)
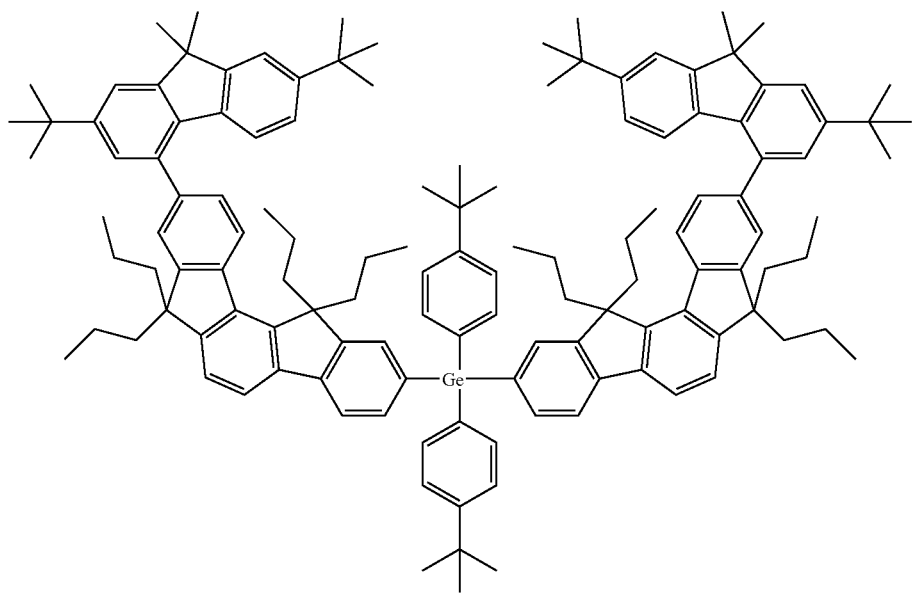
(41)
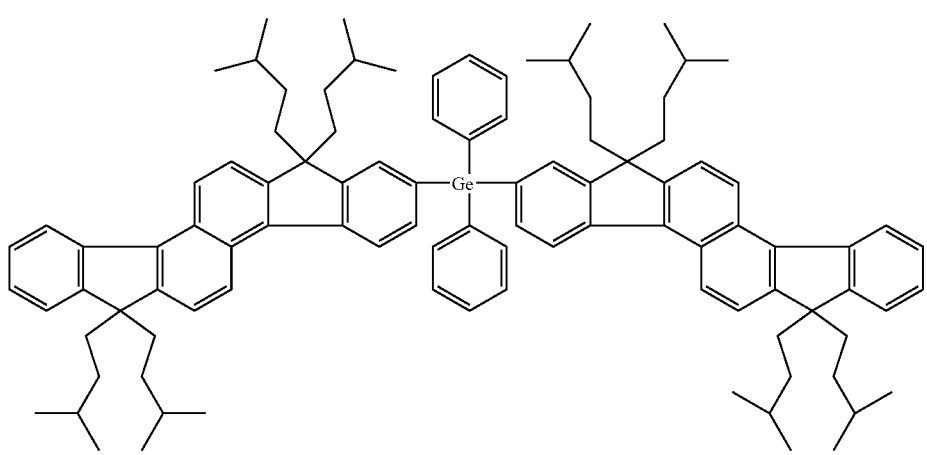
(42)

(43)
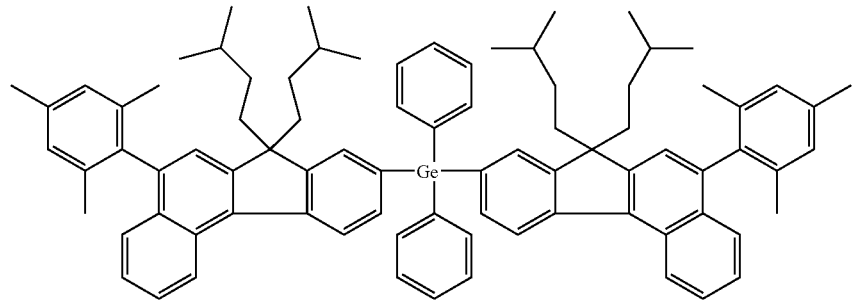
(44)
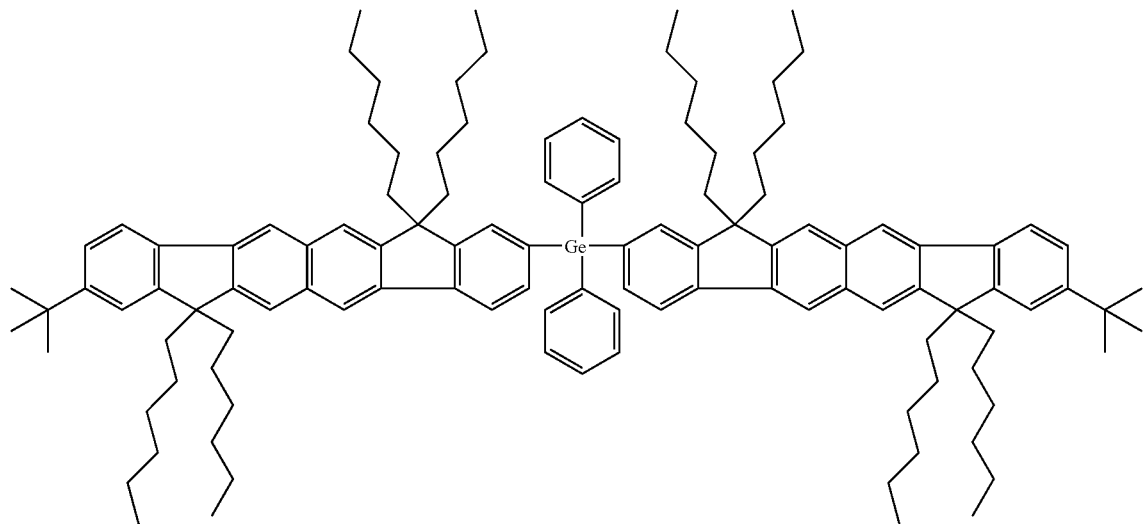
(45)
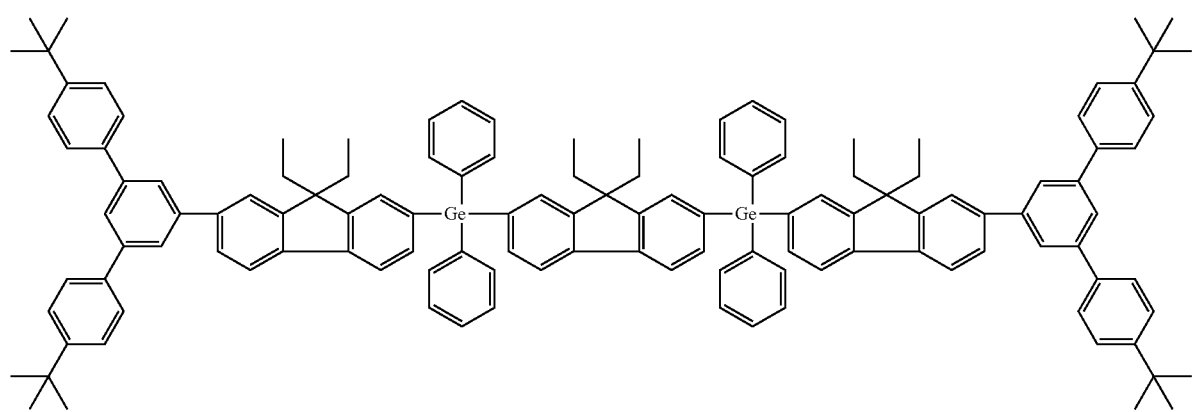

(46)
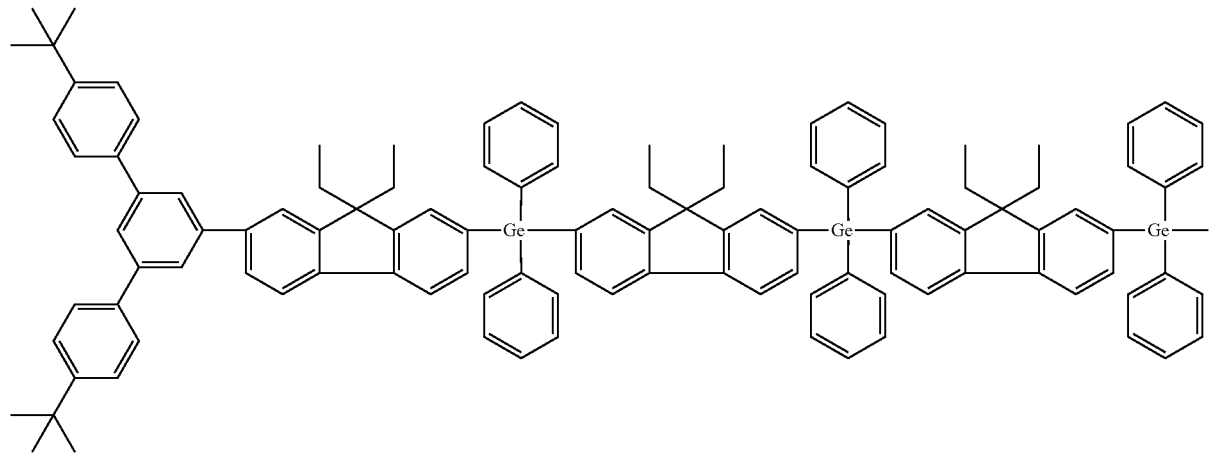
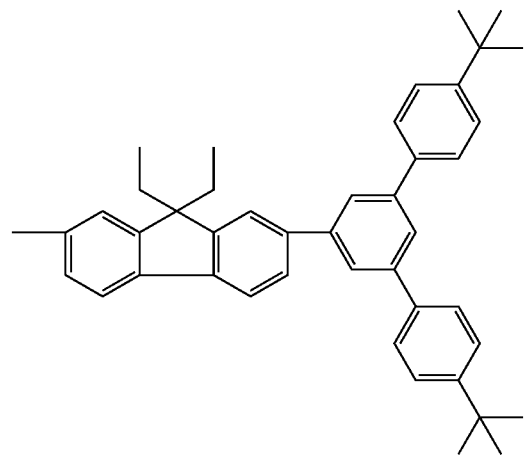
(47)
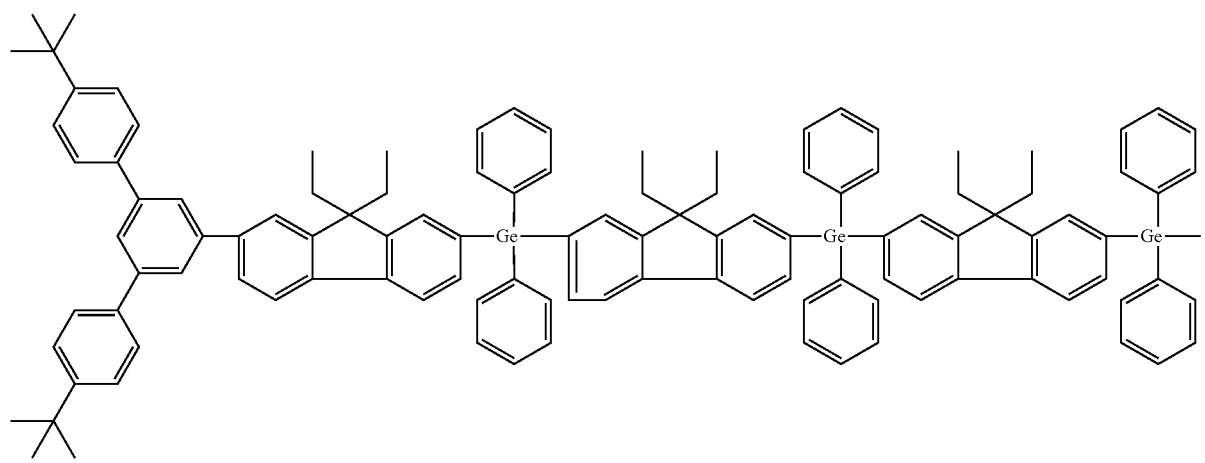

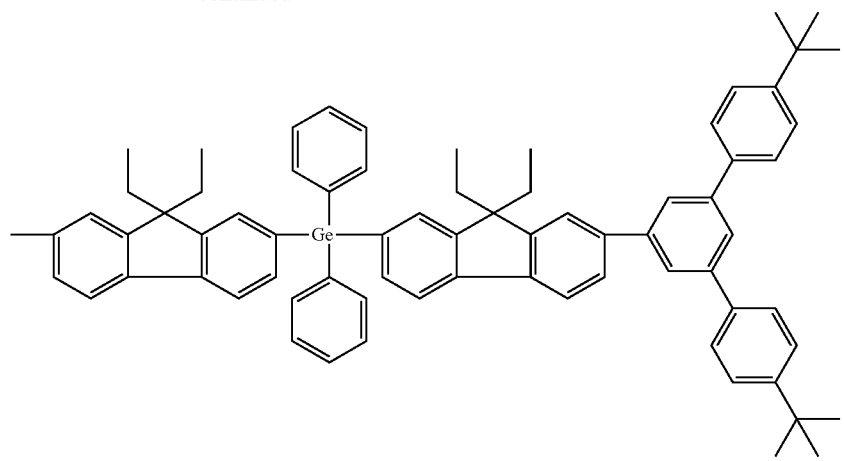
(48)
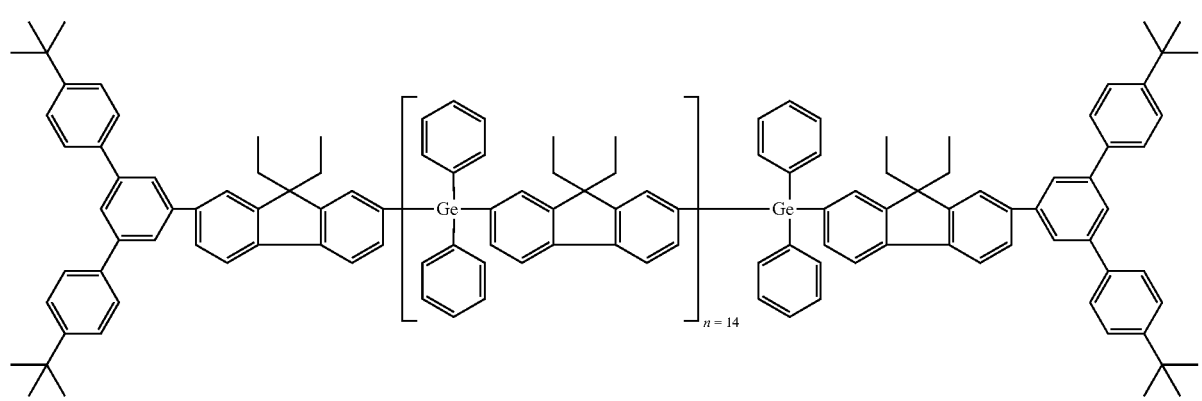
(49)
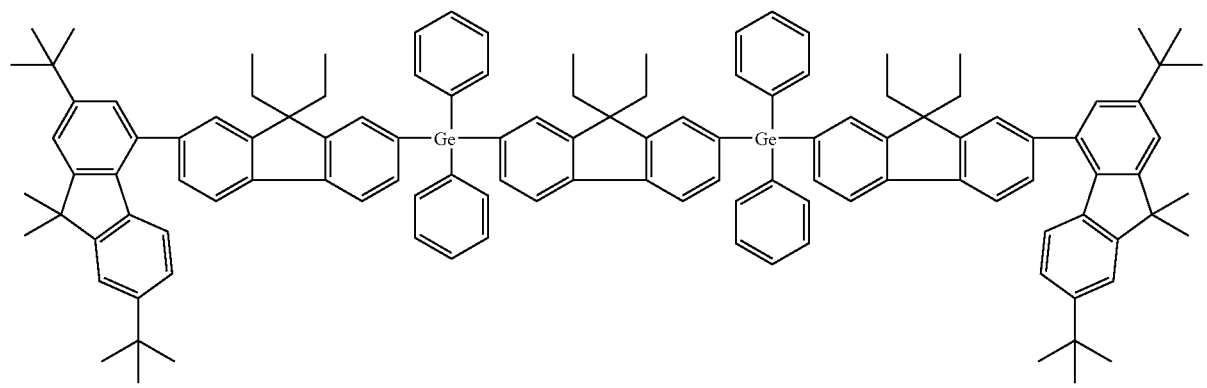
(50)
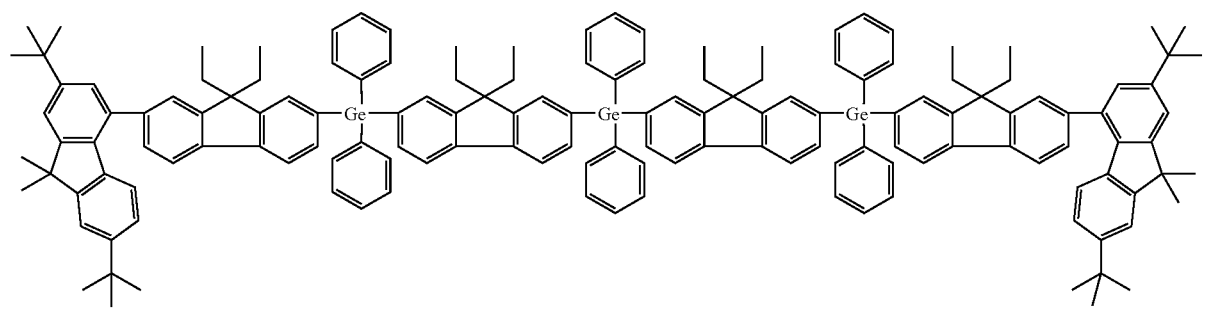

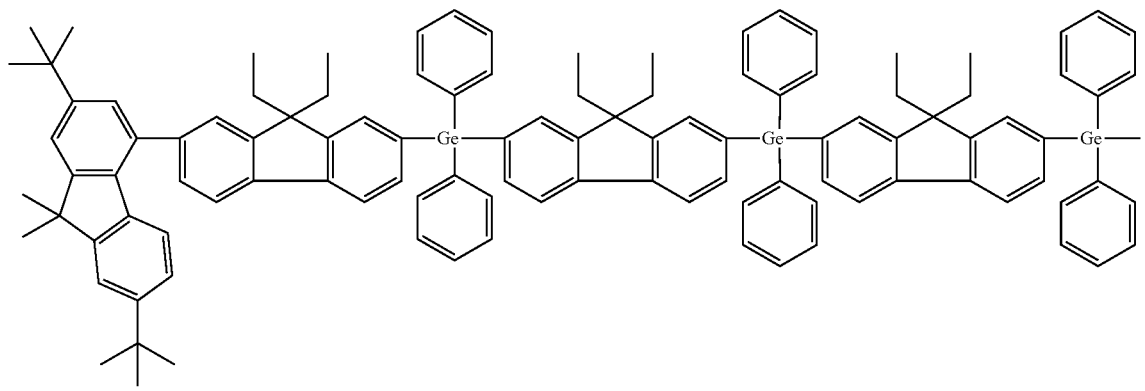
(51)
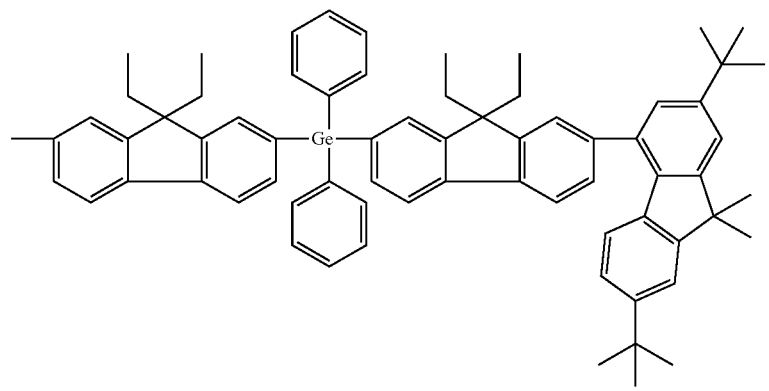
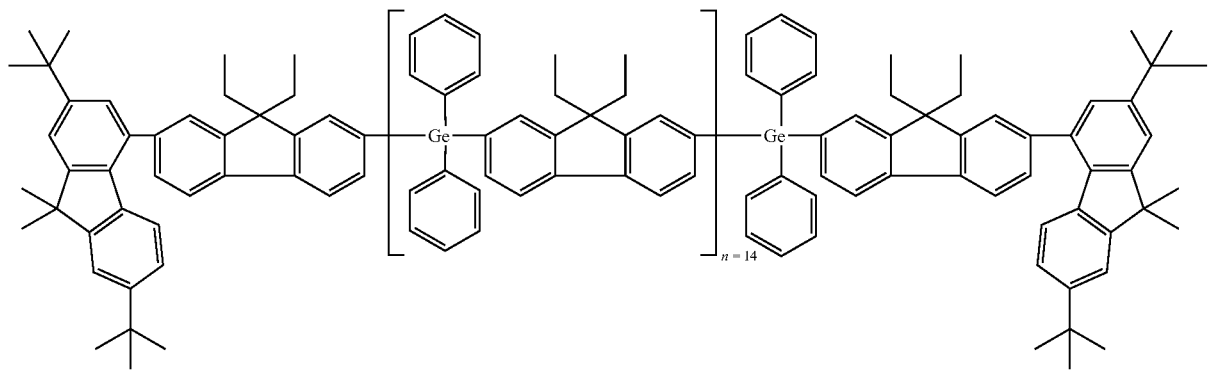
(52)

-continued
(53)
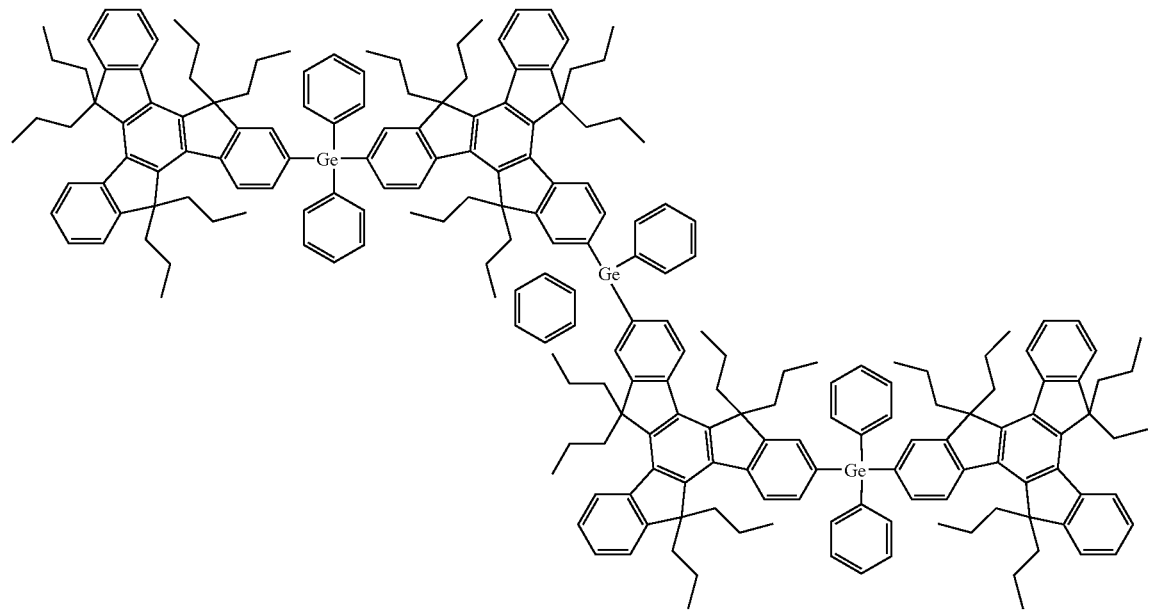
(54)
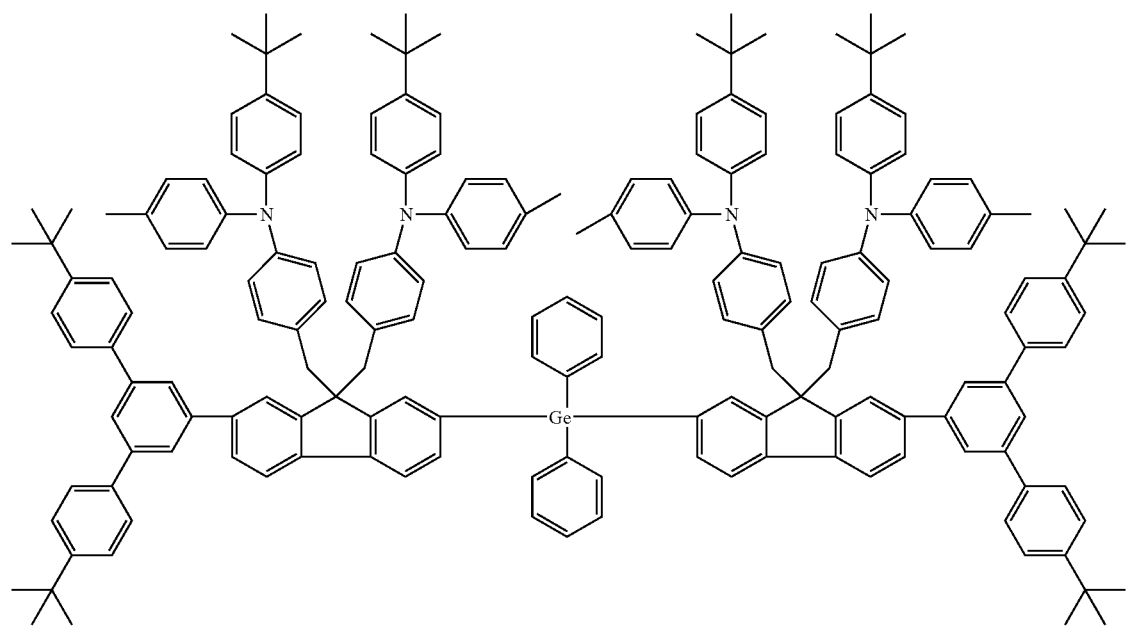

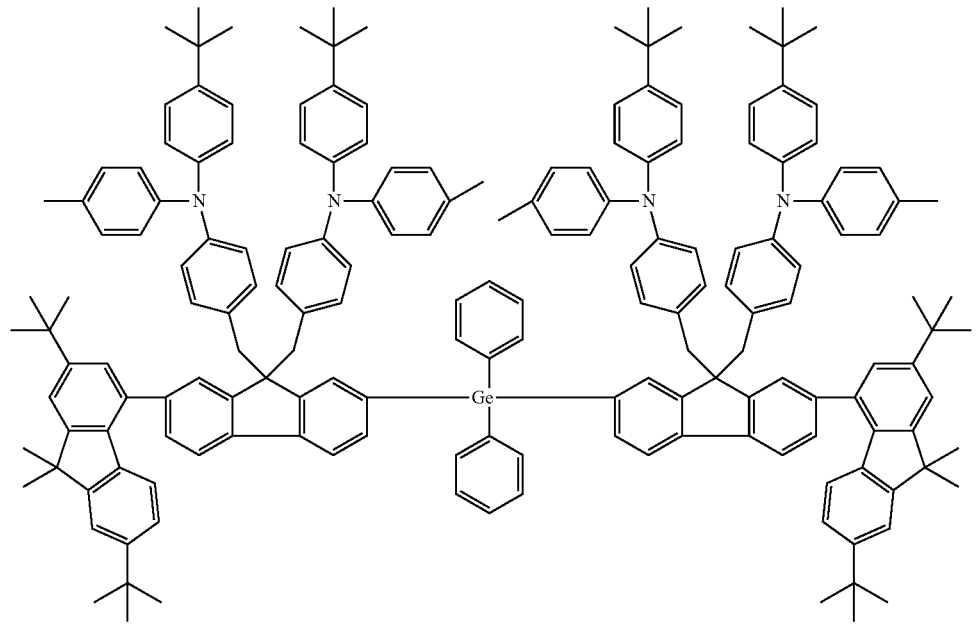
(55)
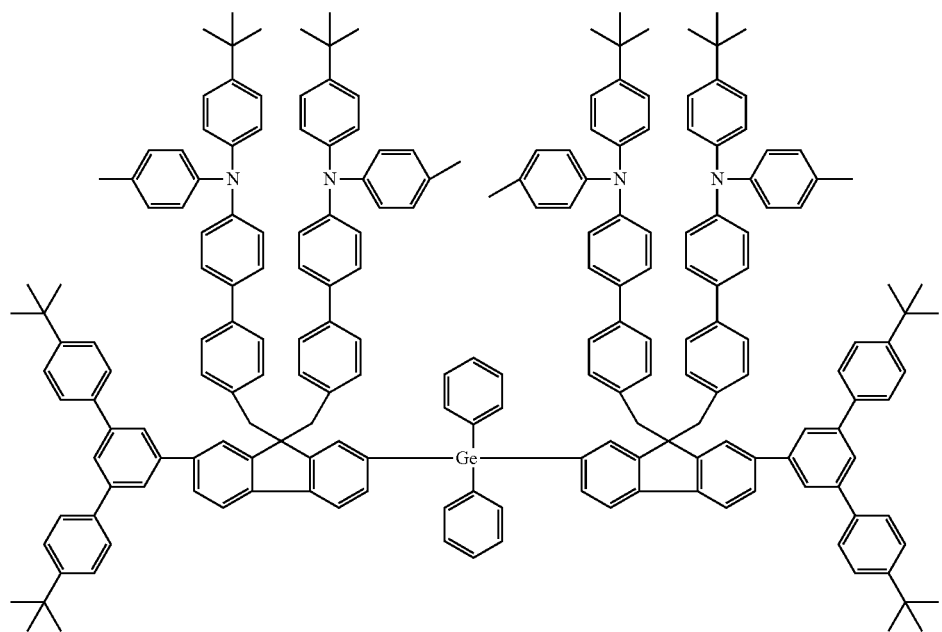
(56)

(57)
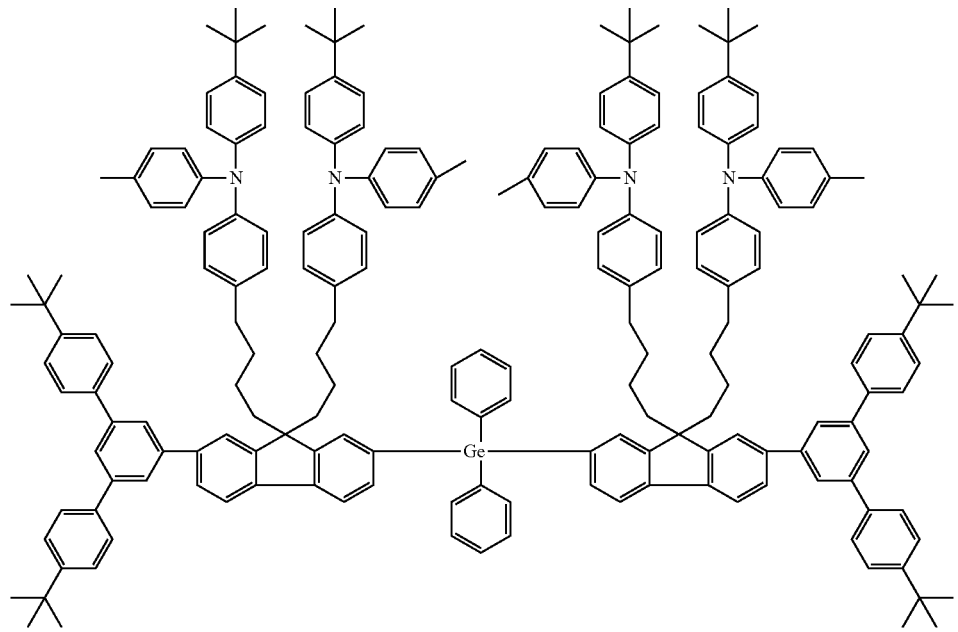
(58)
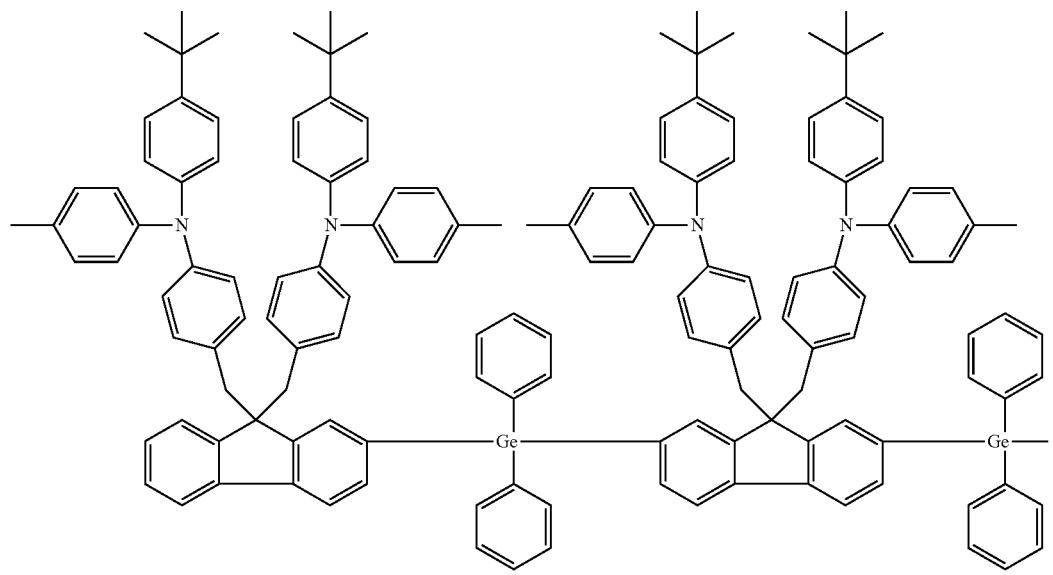

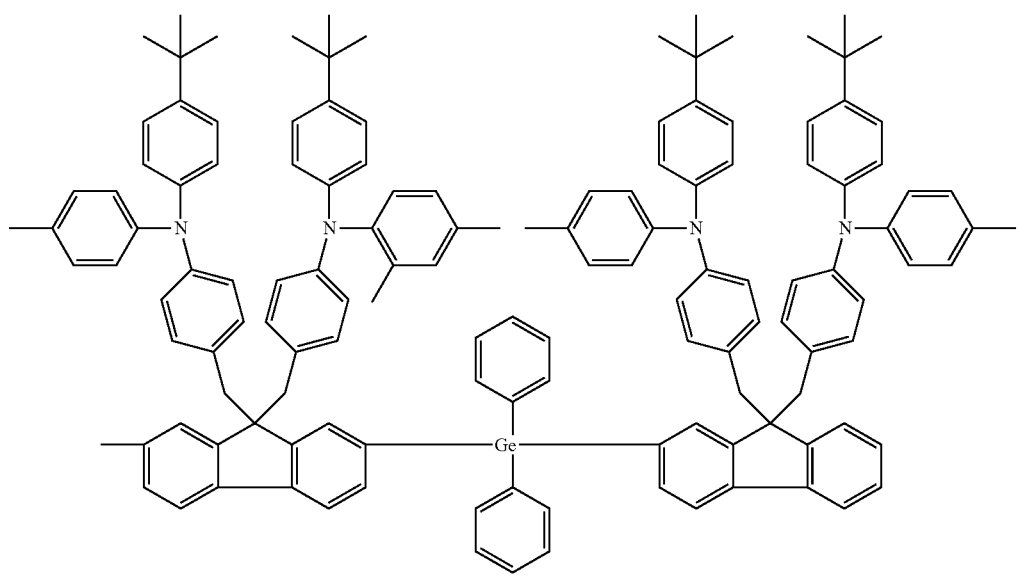
(59)
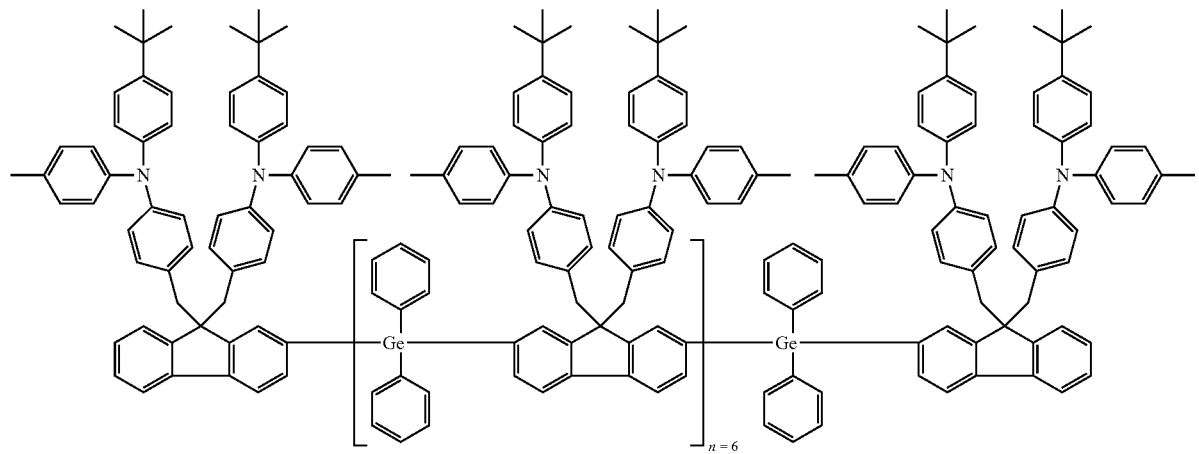
(60)
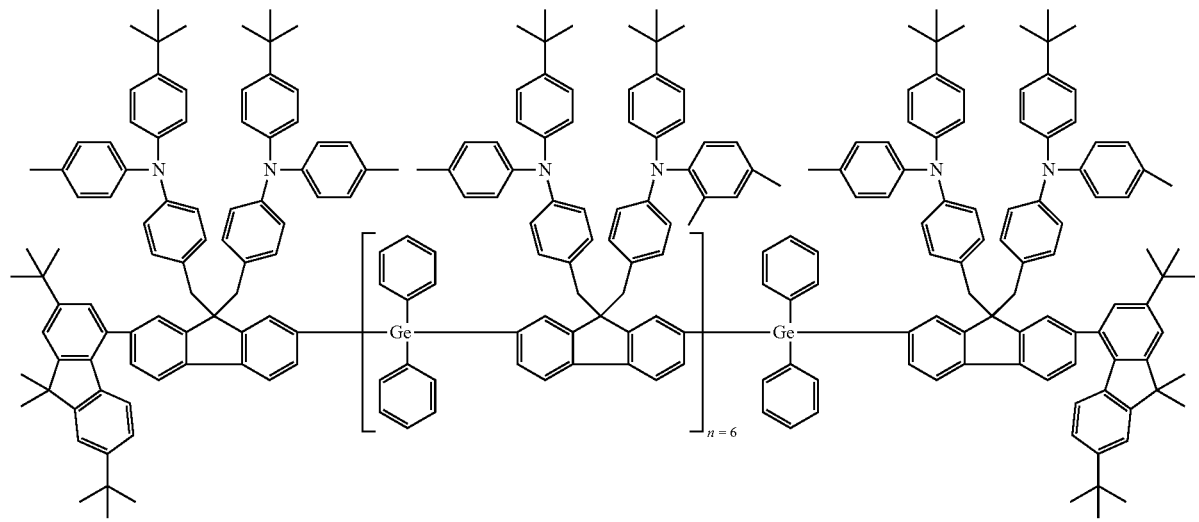

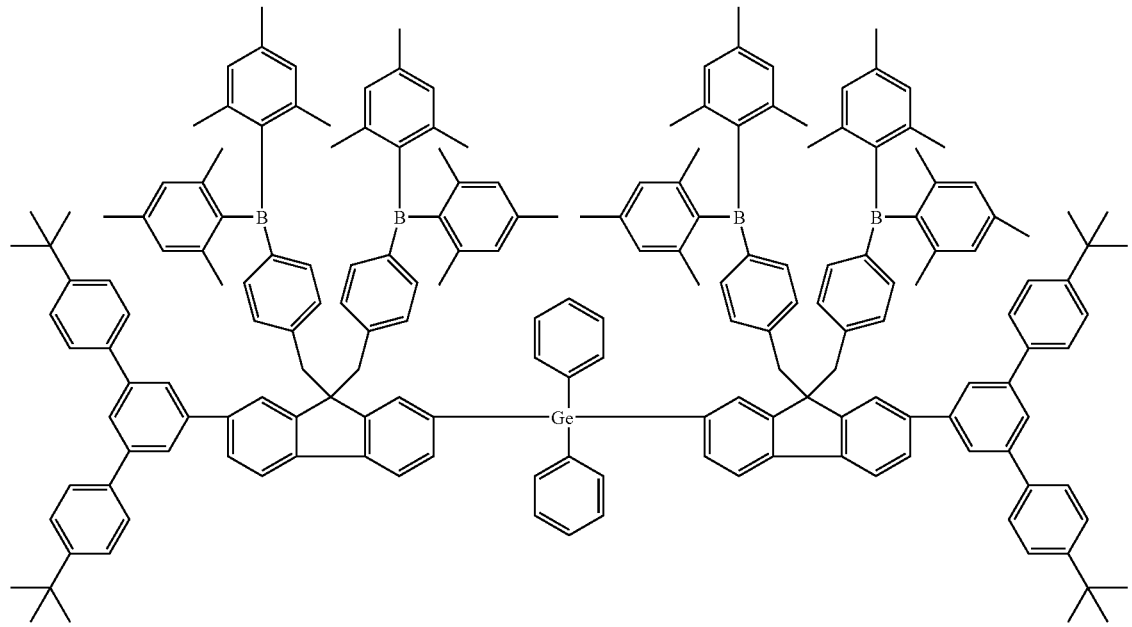
(61)
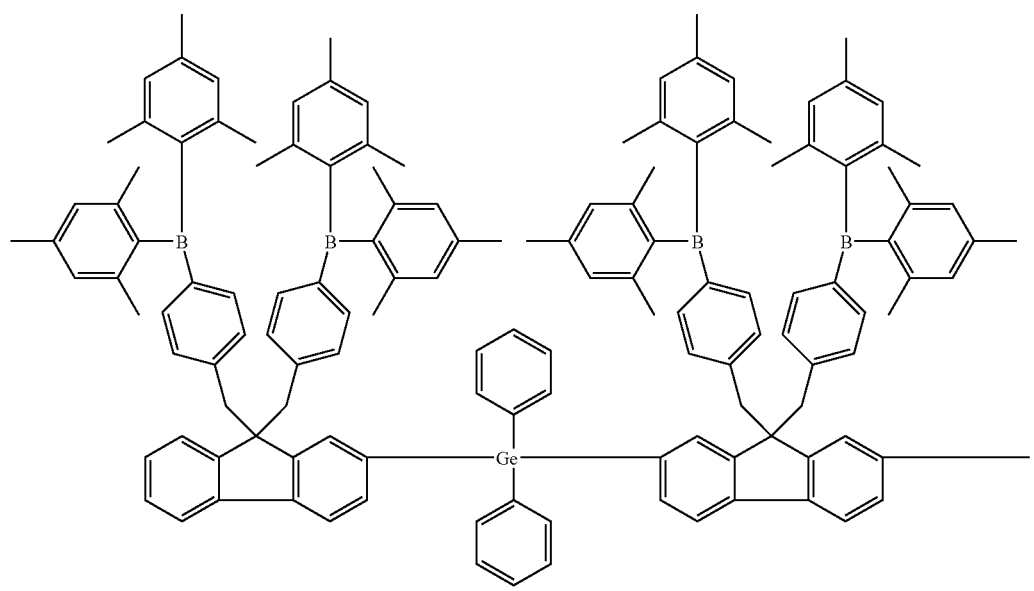
(62)

-continued
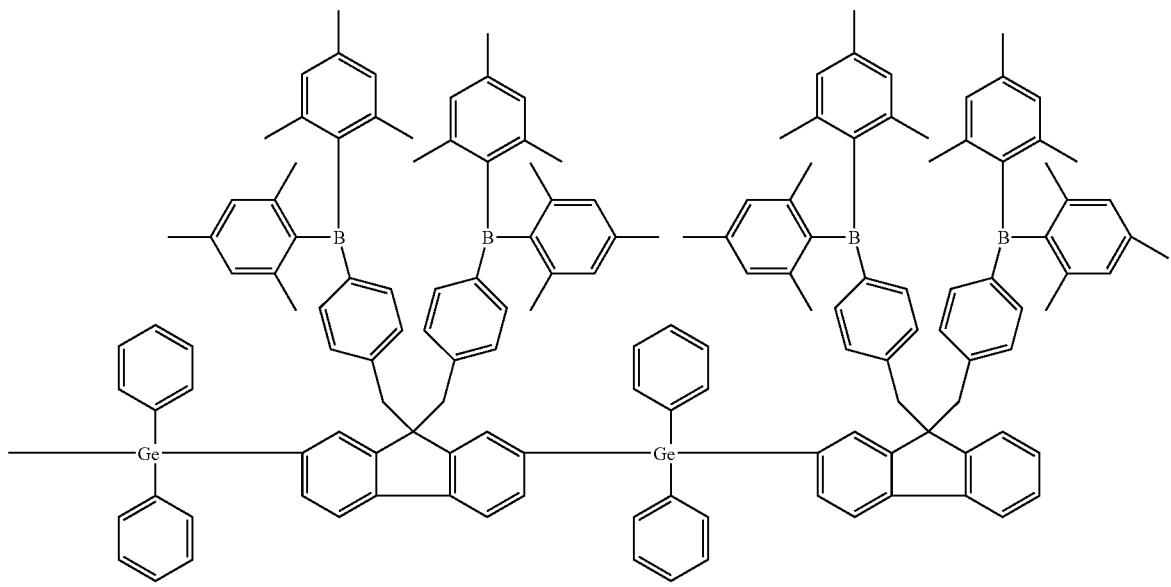
(63)
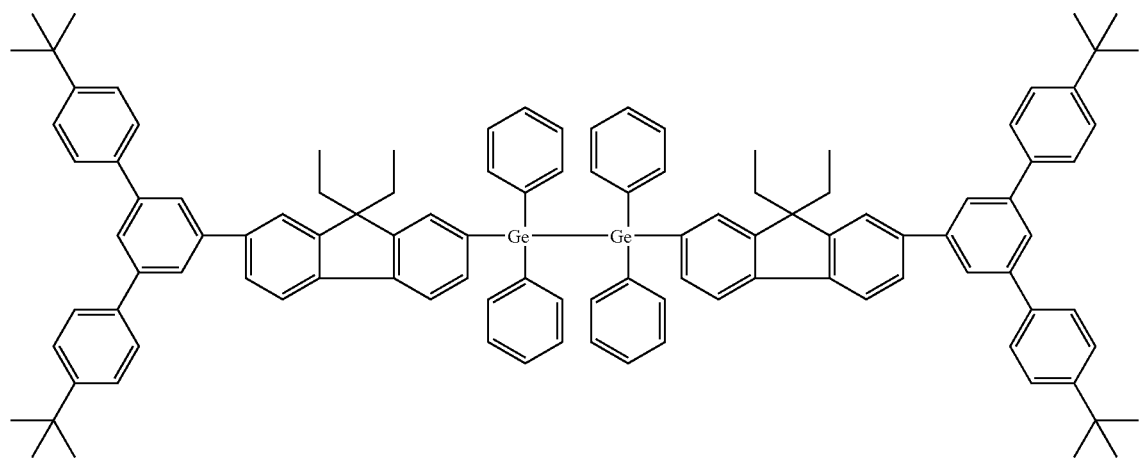
(64)
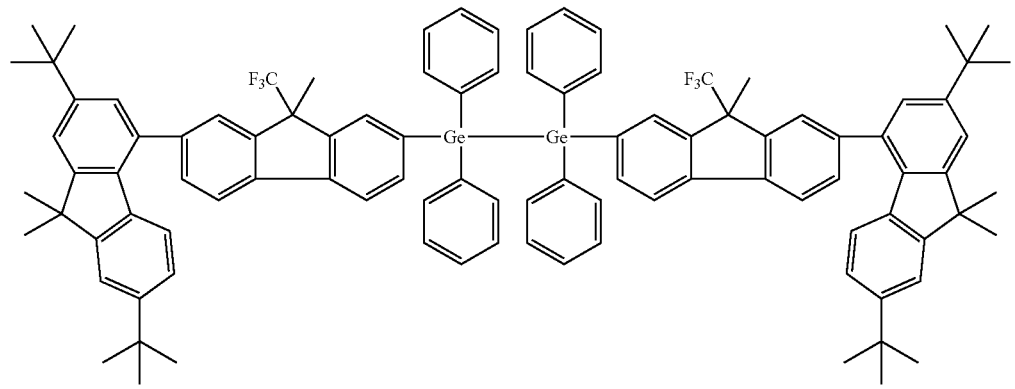

(65)
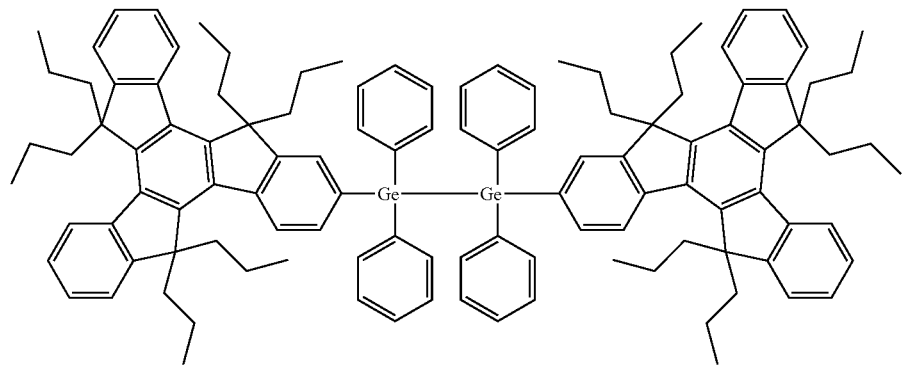
(66)
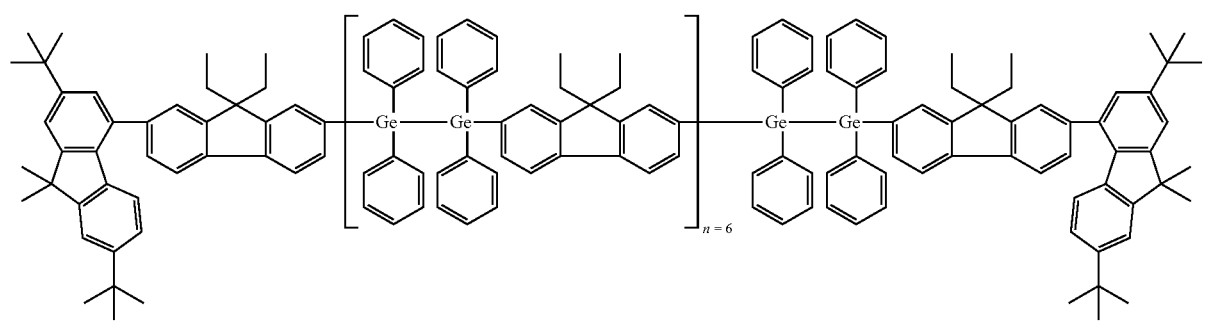
(67)
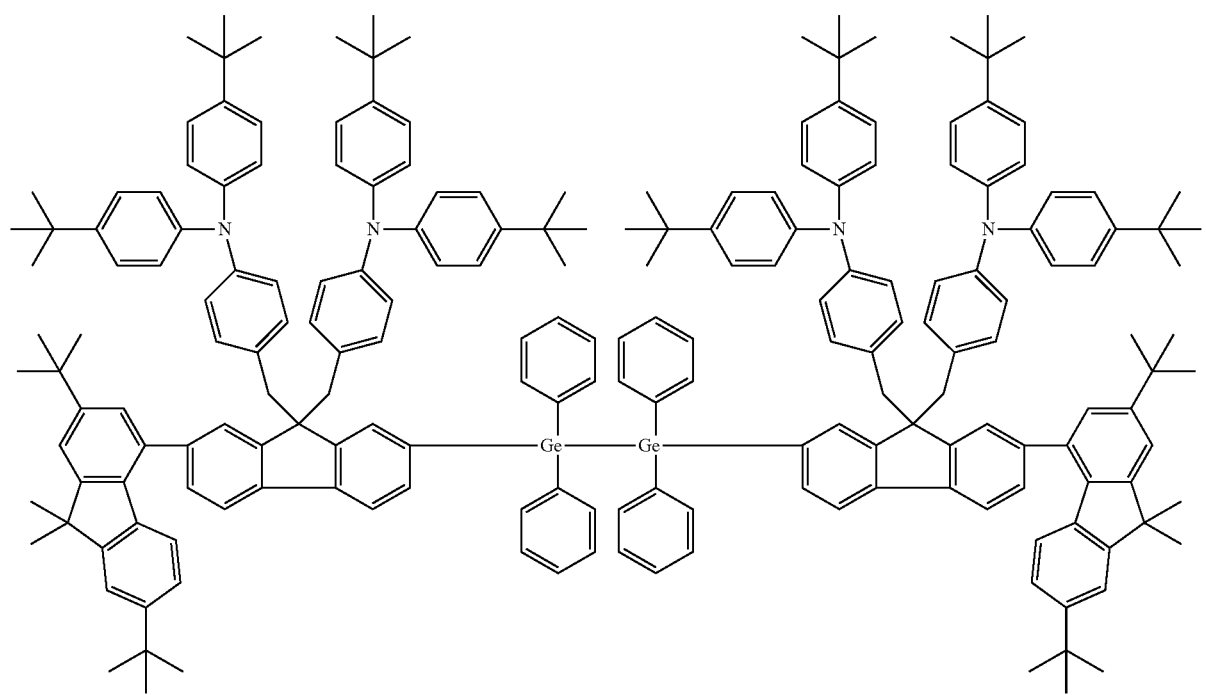

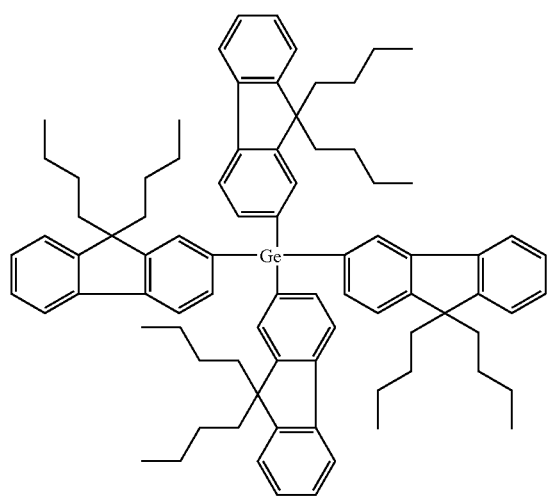
(68)
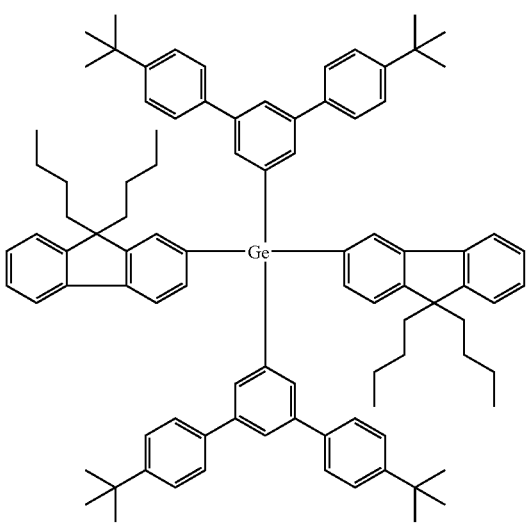
(69)
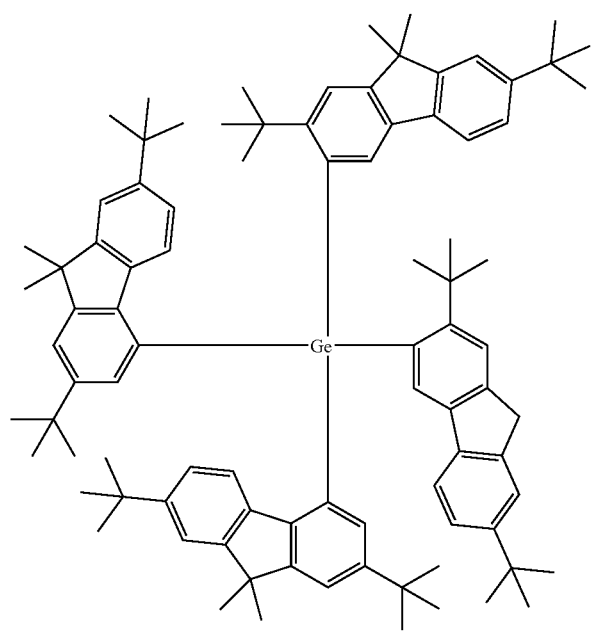
(70)

(71)

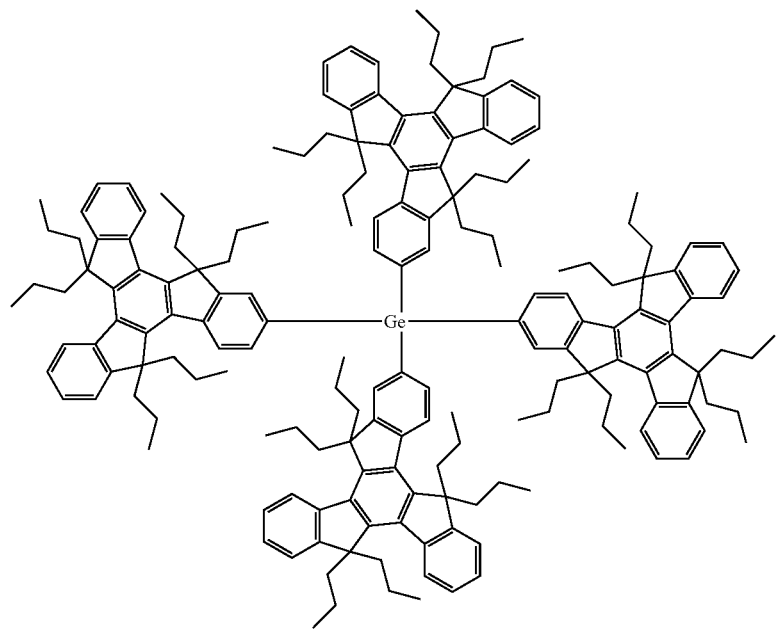

(72)

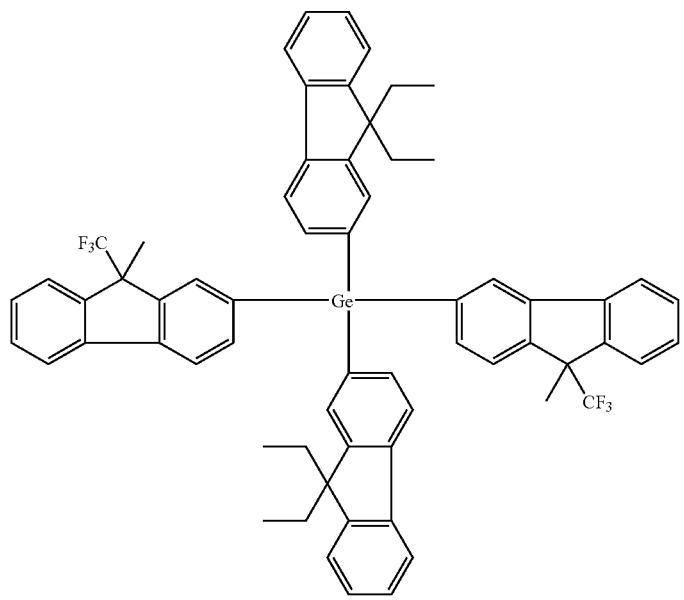

The above organic germanium compound is preferably used as a component for the light-emitting layer 12 shown in each of FIGS. 1A and 1B, or for the multifunctional light-emitting layer 17 shown in FIG. 1C. Here, although the light-emitting layer 12 and the multifunctional light-emitting layer 17 may each be formed only of the above organic germanium compound, each of the layers is preferably formed of a host and a guest. When each of the light-emitting layer 12 and the multifunctional light-emitting layer 17 is formed of a host and a guest, the above organic germanium compound is used as the host. The guest to be incorporated into the light-emitting layer 12 or the multifunctional light-emitting layer 17 together with the host is a fluorescent material or a phosphorescent material.

Specific examples of the fluorescent material or phosphorescent material which are guests include benzooxazole and a derivative thereof, benzoimidazole and a derivative thereof, benzothiazole and a derivative thereof, styrylbenzene and a derivative thereof, polyphenyl and a derivative thereof, diphenylbutadiene and a derivative thereof, tetraphenylbutadiene and a derivative thereof, naphthalimide and a derivative thereof, coumarin and a derivative thereof, a fused aromatic compound, perinone and a derivative thereof, oxadiazole and a derivative thereof, oxadine and a derivative thereof, aldazine and a derivative thereof, pyraridine and a derivative thereof, cyclopendadiene and a derivative thereof, bisstyryl anthracene and a derivative thereof, quinacridon and a derivative thereof, pyrrolopyridine and a derivative thereof, thiadiazoropyridine and a derivative thereof, cyclopentadiene and a derivative thereof, styrylamine and a derivative thereof, diketopyrrolopyrrole and a derivative thereof, an aromatic dimethylidene compound, 8-quinolinol and a metal complex that is a derivative thereof, pyrromethene and a metal complex that is a derivative thereof, a rare earth complex, various kinds of metal complexes such as a transition metal complex, polymer compounds such as polythiophene, polyphenylene, and polyphenylenevinylene, and an organic silane and a derivative thereof. As the light emitting material, preferably, a fused aromatic compound, a quinacridon derivative, diketopyrrolopyrole derivative, a metal complex of a pyrromethene derivative, a rare earth metal complex, and a transition metal complex are used, and more preferably, a fused aromatic compound and a transition metal complex are used.

The organic electroluminescent device of the present invention preferably utilizes phosphorescent emission from a phosphorescent material from the viewpoint of efficiency (external quantum efficiency).

The phosphorescent material is preferably a transition metal complex. In the case of using a transition metal complex as a phosphorescent material, although central metal of a complex is not particularly limited, iridium, platinum, rhenium, or ruthenium is preferably used. Iridium or platinum is more preferred, and iridium is particularly preferred. Herein, as a transition metal complex, specifically, an ortho-metalized complex disclosed by the below-listed documents can be used.

1. Akio Yamamoto, "Organic metal, base and application" pp. 150 and 232, Shokabo Publishing Co., Ltd. (1982)
2. H. Yersin, "Photochemistry and Photophysics of Coordination Compound", pp. 71-77 and 135-146, Springer-Verlag (1987)
3. Japan Society for the Promotion of Science, "Organic Materials for Telecommunication Technology, 142th commission" C meeting (Organic electronics), 9th research meeting document, items 25 to 32 (2005)

In addition to the above, suitably usable phosphorescent materials are disclosed in Patent Documents such as U.S. Pat. Nos. 6,303,231 and 6,097,147, WO 00/57676, WO 00/70655, WO 01/08230, WO 01/39234, WO 01/41512, WO 02/02714, WO 02/15645, Japanese Patent Application Laid-Open No. 2001-247859, Japanese Patent Application Nos. 2000-33561, 2001-189539, 2001-248165, 2001-33684, 2001-239281, and 2001-219909, European Patent No. 1211257, Japanese Patent Application Laid-Open Nos. 2002-226495, 2002-234894, 2001-247859, 2001-298470, 2002-173674, 2002-203678, and 2002-203679.

In addition, suitably usable phosphorescent materials are disclosed in non-patent documents such as Nature, Vol. 39, p. 151 (1998); Applied Physics Letters, Vol. 75, p. 4 (1999); Polymer Preprints, Vol. 41, p. 770 (2000); Journal of American Chemical Society, Vol. 123, p. 4304 (2001); and Applied Physics Letters, Vol. 79, p. 2082 (1999).

The light-emitting layer 12 or the multifunctional light-emitting layer 17 more preferably further contains a compound having carrier transportability as a third material in addition to the organic germanium compound and the fluorescent or phosphorescent material.

The compound having carrier transportability as a third material has one of a function of transporting holes and a function of transporting electrons. A material that can be suitably used as the carrier transportable compound is, for example, a compound having, in itself, a skeleton such as a carbazole, triazole, oxazole, oxadiazole, imidazole, polyarylalkane, pyrazoline, pyrazolone, phenylenediamine, arylamine, amino-substituted chalcone, styrylanthracene, fluorenone, hydrazone, stilbene, or silazane, a conductive high-molecular weight oligomer such as an aromatic tertiary amine compound, a styrylamine compound, an aromatic dimethylidyne-based compound, a porphyrin-based compound, a polysilane-based compound, poly(N-vinylcarbazole), an aniline-based copolymer, a thiophene oligomer, or polythiophene, or a derivative of any one of them.

The content of the organic germanium compound represented by the general formula [1] or the general formula [2] in the corresponding layer formed of an organic compound is preferably 50 mass % to 99 mass %, or more preferably 70 mass % to 95 mass % except for the case where the organic germanium compound is used alone.

Next, a component for the organic electroluminescent device except the organic germanium compound will be described.

The material used in the interlayer 16 may be the organic germanium compound, but it is not particularly limited thereto as long as it has a wide gap and carrier transportability, and is excellent in film stability (electrical, chemical, or thermal stability) For example, polyvinyl carbazole (PVK) can be included.

In addition to the organic germanium compound, examples of materials which constitute the hole injecting/transporting layer 13 include triarylamine derivatives, phenylene diamine derivatives, triazole derivatives, imidazole derivatives, pyrazoline derivatives, pyrazolone derivatives, fluorenone derivatives, hydrazone derivatives, stilbene derivatives, phthalocyanine derivatives, porphyrin derivatives, poly(vinylcarbazole), poly(silylene), poly(thiophene), poly(3,4-ethylenedioxythiophene), and PEDOT/PSS (mixtures of poly[3,4-ethylenedioxythiophene]/polystyrene sulfonic acid).

Examples of the material constituting the substrate are not particularly limited, and include an inorganic material such as zirconium-stabilized yttrium or glass; and polymer materials such as polyesters including polyethylene terephthalate, polybutylene terephthalate, and polyethylene naphthalate, and polyethylene, polycarbonate, polyethersulfone, polyarylate, allyldiglycol carbonate, polyimide, polycycloolefin, norbornene resin, poly(chlorotrifluoroethylene), polytetrafluoroethylene, polytetrafluoroethylene-polyethylene copolymer, or the like.

An anode (transparent electrode 14) having a thickness of 50 nm or more and 500 nm or less is provided on the substrate. The material constituting the anode is not particularly limited; for example, a metal, an alloy, a metal oxide, or an electrically conductive compound, or a mixture obtained by combining two or more of them can be used as the material, and the preferred material is one having a work function of 4 eV or more. Specific examples of the material include: conductive metal oxides such as tin oxide, zinc oxide, indium oxide, and indium tin oxide (ITO); metal elements such as gold, silver, chromium, and nickel; a mixture and a stack each obtained by combining any of such metal elements and any of such conductive metal oxides; inorganic conductive substances such as copper iodide and copper sulfide; organic conductive materials such as polyaniline, polythiophene, and polypyrrole; and a stack obtained by combining any one of these materials and ITO. Of those, a conductive metal oxide is preferable, and ITO is more preferable from the viewpoint of, for example, productivity, high conductivity, and transparency.

In the organic electroluminescent device of the present invention, at least one layer including an organic compound is provided on the anode (transparent electrode 14), and a cathode (metal electrode 11) is provided on the layer including the organic compound.

The material constituting the metal electrode as the cathode is not particularly limited, but specific examples of the component include: alkali metals (such as Li, Na, K, and Cs); alkaline earth metals (such as Mg and Ca); metal elements such as gold, silver, lead, and aluminum; alloys each obtained by combining multiple kinds of these metal elements (such as a sodium-potassium alloy, a lithium-aluminum alloy, and a magnesium-silver alloy); fluorides of the alkali metals; oxides of the alkali metals; fluorides of the alkaline earth metals; oxides of the alkaline earth metals; carbonates of indium and cesium; and rare earth metals such as ytterbium. Of those, a material having a work function of 4 eV or less is preferable. In addition, the cathode may be of a single-layer structure, or may be of a stack structure formed of multiple layers. When the cathode is of a stack structure, the stack structure is preferably formed of aluminum and lithium fluoride, or of aluminum and lithium oxide.

It is preferred that the organic electroluminescent device of the present invention be finally covered with a protective layer. As a material for the protective layer, those which have a function of preventing a substance that promotes device degradation such as water and oxygen from intruding into the device may be used. Specific examples thereof include: metal elements such as In, Sn, Pb, Au, Cu, Ag, Al, Ti, and Ni; metal oxides such as MgO, SiO, $SiO_2$, $Al_2O_3$, GeO, NiO, CaO, BaO, $Fe_2O_3$, $Y_2O_3$, and $TiO_2$; metal fluorides such as $MgF_2$, LiF, $AlF_3$, and $CaF_2$; nitrides such as $SiN_x$ and $SiO_xN_y$; polyethylene; polypropylene; polymethylmethacrylate; polyimide; polyurea; polytetrafluoroethylene; polychlorotrifluoroethylene; polydichlorodifluoroethylene; a copolymer of chlorotrifluoroethylene and dichlorodifluoroethylene; a copolymer obtained by copolymerizing a monomer mixture containing tetrafluoroethylene and at least one kind of comonomer; a fluorene-containing copolymer having a cyclic structure in a copolymer main chain; a water-absorbing material with a water-absorbing ratio of 1% or more; and a moisture-proof material with a water-absorbing ratio of 0.1% or less.

The method of forming a layer including an organic compound that constitutes the organic electroluminescent device is not particularly limited; a Dry process such as resistive heating deposition, electron beam deposition, sputtering, or a molecular layer-by-layer growth can be adopted as the method. Meanwhile, an application method (Wet process) such as a coating method (for example, a spin coating method, a casting method, or a dip coating method), an ink-jet method, a printing method, an LB method, or a transfer method can also be adopted. It is preferable that the layer including an organic compound, in particular, the light-emitting layer 12 (including the multifunctional light-emitting layer 17) be formed by the Wet process; it is more preferable that all the layers each including an organic compound be formed by the Wet process. Here, when the light-emitting layer 12 is formed by the Wet process, an ink for application prepared by dissolving the organic germanium compound in an organic solvent having a solubility parameter of 6.0 $(cal \cdot cm^{-3})^{1/2}$ to 14.5 $(cal \cdot cm^{-3})^{1/2}$ is used, and an ink for application prepared by dissolving the organic germanium compound in an organic solvent having a solubility parameter of 6.5 $(cal \cdot cm^{-3})^{1/2}$ to 13.0 $(cal \cdot cm^{-3})^{1/2}$ is preferably used. (For the relationship between a solvent and a solubility parameter, see, for example, Solvent Pocketbook, 1st edition, 16th copy, 11th section, published by the Society of Synthetic Organic Chemistry, Japan). In addition, upon preparation of the ink for application, the organic germanium compound is dissolved at a concentration of preferably 1.0 wt % or more. The ink can be suitably used as an excellent ink for application for the application method (Wet process) as long as the concentration is 1.0 wt % or more; provided that a general upper limit for the concentration is 30 wt % for the reason of, for example, need for the formation of a layer having a uniform thickness.

For example, when the light-emitting layer 12 and the hole injecting/transporting layer 13 as layers each including an organic compound in the organic electroluminescent device 1a shown in FIG. 1A are each formed by the application method (Wet process), the following method is adopted.

To be specific, first, an aqueous solution of, for example, polyethylenedioxythiophene/polystyrene sulfonate (PDOT/PSS) is formed into a film on an ITO substrate so as to serve as the hole injecting/transporting layer 13. Next, the light-emitting layer is formed on the PDOT/PSS film by using an ink for application formed of the organic germanium compound, a fluorescent or phosphorescent light emitting material (a carrier transporting material is also added in some cases), and a solvent.

On the other hand, there is no particular limit to the method of forming a protective layer covering the organic light emitting device, and for example, a vacuum vapor deposition method, a sputtering method, a reactive sputtering method, a molecular beam epitaxy (MBE) method, a cluster ion beam method, an ion plating method, a plasma polymerization (high-frequency excitation ion plating) method, a plasma CVD method, a laser CVD method, a thermal CVD method, a gas source CVD method, a coating method, a printing method, and a transfer method can be applied.

In the organic electroluminescent device of the present invention, the light extraction efficiency, the color purity, and the like can be improved by use of various known means. For example, by forming the shape of a substrate surface (for example, form a fine uneven pattern), controlling the refractive indices of a substrate/an ITO layer/an organic layer, controlling the thicknesses of a substrate/an ITO layer/an organic layer, and the like, the light extraction efficiency and the external quantum efficiency can be improved. It is also possible to improve the color purity by a method of reducing an excessive wavelength component using a micro-cavity structure (micro resonator structure), obtaining a desired color with a color filter, and the like.

The organic electroluminescent device of the present invention may be of the so-called top emission system in which light is extracted from an anode side for the purpose of enhancing the aperture ratio, or a cavity structure of adjusting the color purity by optical buffering.

The organic electroluminescent device of the present invention is applicable to a product which requires energy conservation and high luminance. As application examples, an image display apparatus, a light source of a printer, an illumination apparatus, a backlight of a liquid crystal display apparatus, and the like are conceivable.

An example of the image display apparatus includes an energy-saving, light-weight flat panel display with high visibility.

Further, as the light source of a printer, for example, a laser light source portion of a laser beam printer that has been currently used widely can be replaced by the organic electroluminescent device of the present invention. An example of a replacement method includes a method of placing an organic electroluminescent device that can be addressed independently on an array. Even if the laser light source portion is replaced by the organic electroluminescent device of the present invention, there is no particular difference in the formation of an image from a conventional example by conducting desired light exposure to a photosensitive drum. The volume of an apparatus can be reduced remarkably by using the organic electroluminescent device of the present invention.

Regarding the illumination apparatus and the backlight, the effect of saving energy can be expected by using the organic electroluminescent device of the present invention.

Next, the display apparatus using the organic electroluminescent device of the present invention will be described. Hereinafter, the display apparatus of the present invention will be described in detail by exemplifying an active matrix system with reference to the accompanying drawings.

Figure 2:
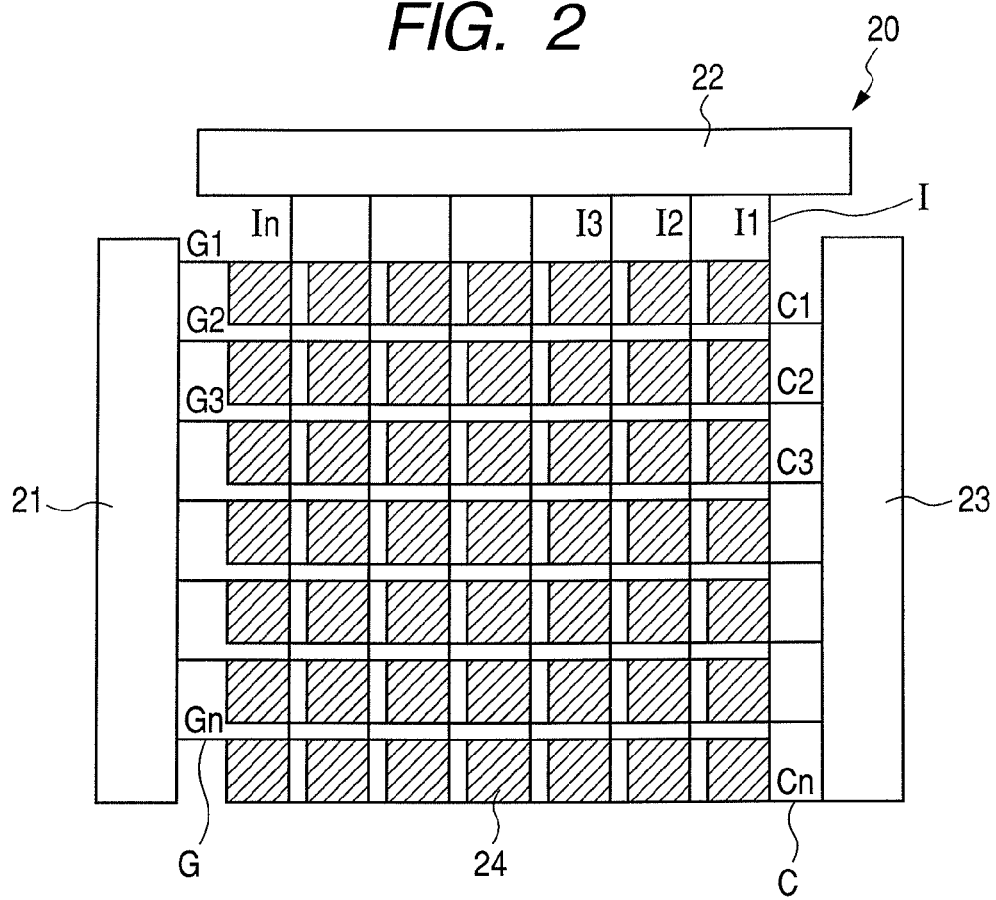
FIG. 2 is a view schematically illustrating an example of the constitution of a display apparatus including the organic electroluminescent device of the present invention and a driving unit.

FIG. 2 is a view schematically illustrating a constitution of a display apparatus according to an embodiment of the present invention including the organic electroluminescent device of the present invention and a driving unit. In a display apparatus 20 illustrated in FIG. 2, a scanning signal driver 21, an information signal driver 22, and a current supply source 23 are disposed, which are each connected to gate selection lines G, information signal lines I, and current supply lines C. A pixel circuit 24 is disposed at a crossing point of the gate selection line G and the information signal line I. The scanning signal driver 21 successively selects gate selection lines G1, G2, G3, . . . or Gn, and in synchronization therewith, an image signal is applied from the information signal driver 22 to the pixel circuit 24 through any of the information signal lines I1, I2, I3, . . . or In.

Figure 3:
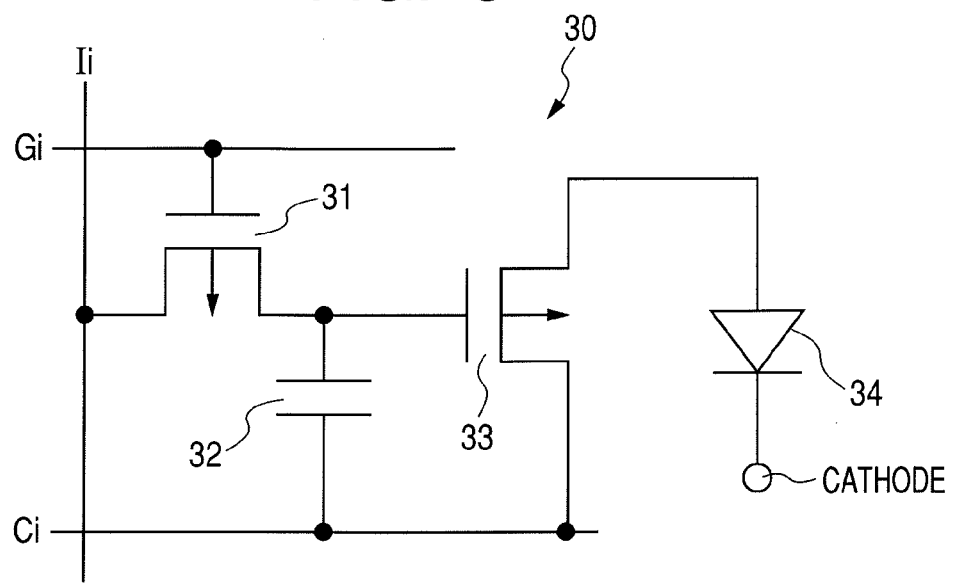
FIG. 3 is a circuit diagram illustrating a circuit that constitutes one pixel disposed in the display apparatus shown in FIG. 2.

Next, the operation of the pixel will be described. FIG. 3 is a circuit diagram illustrating a circuit constituting one pixel disposed in the display apparatus shown in FIG. 2. In a pixel circuit 30 of FIG. 3, when a selection signal is applied to the gate selection line G1, a first thin film transistor (TFT1) 31 is turned on, and an image signal Ii is supplied to a capacitor ($C_{add}$) 32, whereby a gate voltage of a second thin film transistor (TFT2) 33 is determined. A current is supplied to an organic electroluminescent device 34 from a current supply line Ci according to a gate voltage of the second thin film transistor (TFT2) 33. The gate potential of the second thin film transistor (TFT2) 33 is held at the capacitor ($C_{add}$) 32 until the first thin film transistor (TFT1) 31 is scanned and selected next. Therefore, a current continues to flow through the organic electroluminescent device 34 until the subsequent scanning is conducted. This enables the organic electroluminescent device 34 to emit light at all times during one frame.

Figure 4:
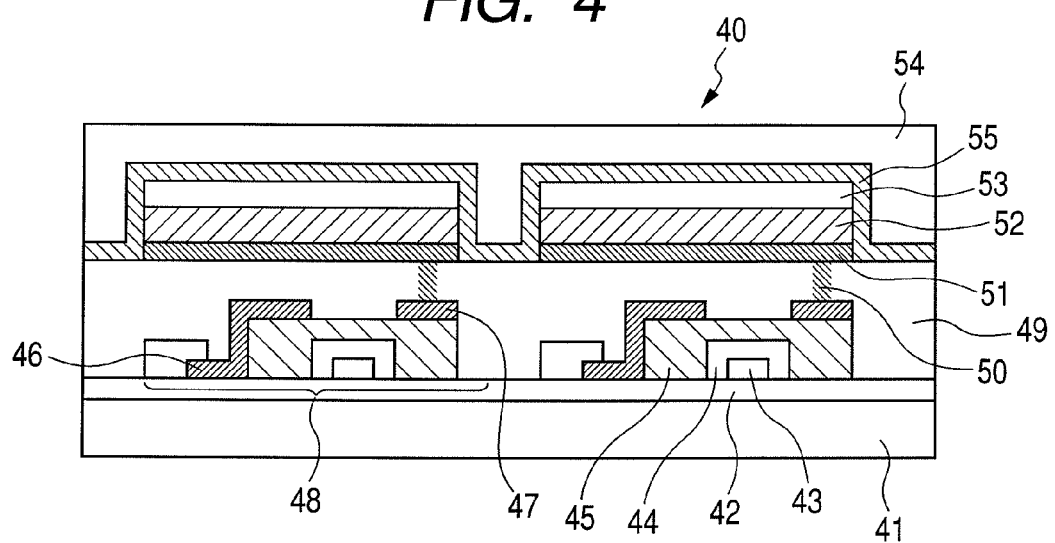
FIG. 4 is a schematic view illustrating an example of the cross-sectional structure of a TFT substrate.

FIG. 4 is a schematic view illustrating an example of a cross-sectional structure of a TFT substrate used in the display apparatus of FIG. 2. The detail of the structure will be described by way of an example of the production process of a TFT substrate. When the display apparatus 40 of FIG. 4 is produced, a substrate 41 formed of glass or the like is coated with a moisture resistant film 42 for protecting a member (a TFT or an organic layer) formed in an upper portion. As a material constituting the moisture resistant film 42, silicon oxide, a composite of silicon oxide and silicon nitride, or the like is used. Next, a metal such as Cr is formed into a film by sputtering and patterned to a predetermined circuit shape, whereby a gate electrode 43 is formed. Subsequently, silicon oxide or the like is formed into a film by a plasma CVD, a catalyst chemical vapor deposition (cat-CVD), or the like, and patterned to form a gate insulating film 44. Next, a silicon film is formed by a plasma CVD (by annealing at a temperature of 290° C. or higher in some cases), and patterned according to a circuit shape, whereby a semiconductor layer 45 is formed.

Further, a drain electrode 46 and a source electrode 47 are provided on the semiconductor film 45 to produce a TFT element 48, whereby a circuit as illustrated in FIG. 3 is formed. Next, an insulating film 49 is formed in an upper portion of the TFT element 48. Next, a contact hole (through-hole) 50 is formed so that an anode 51 for an organic electroluminescent device formed of a metal comes into contact with the source electrode 47.

A multi-layer or single-layer organic layer 52 and a cathode 53 are successively laminated on the anode 51, whereby a display apparatus 40 can be obtained. At this time, in order to prevent the degradation of the organic electroluminescent device, a first protective layer 54 and a second protective layer 55 may be provided. By driving the display apparatus using the fluorene compound of the present invention, a display of a satisfactory quality, which is stable for a display for a long period of time, can be conducted.

In the display apparatus, there is no particular limit to a switching element, and any switching element can be easily applied to a single crystal silicon substrate, an MIM element, an a-Si type, and the like.

EXAMPLES

Hereinafter, the present invention will be described in detail below with reference to examples. However, the present invention is not limited thereto.

Organic germanium compounds used in examples (Compounds 1 to 4) and compounds used in comparative examples (Compound 5 and Compound 6) are shown below. Here, Compound 5 and Compound 6 are each a compound disclosed in Applied Physics Letters, 83, 3, 818 (2003).

Compound 1

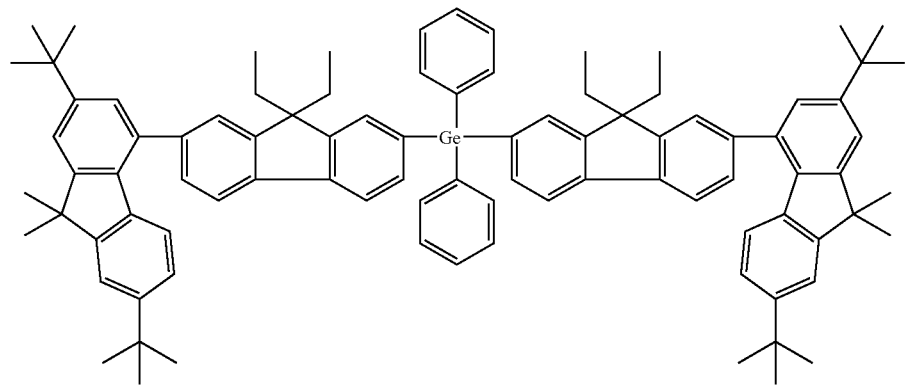

-continued
Compound 2
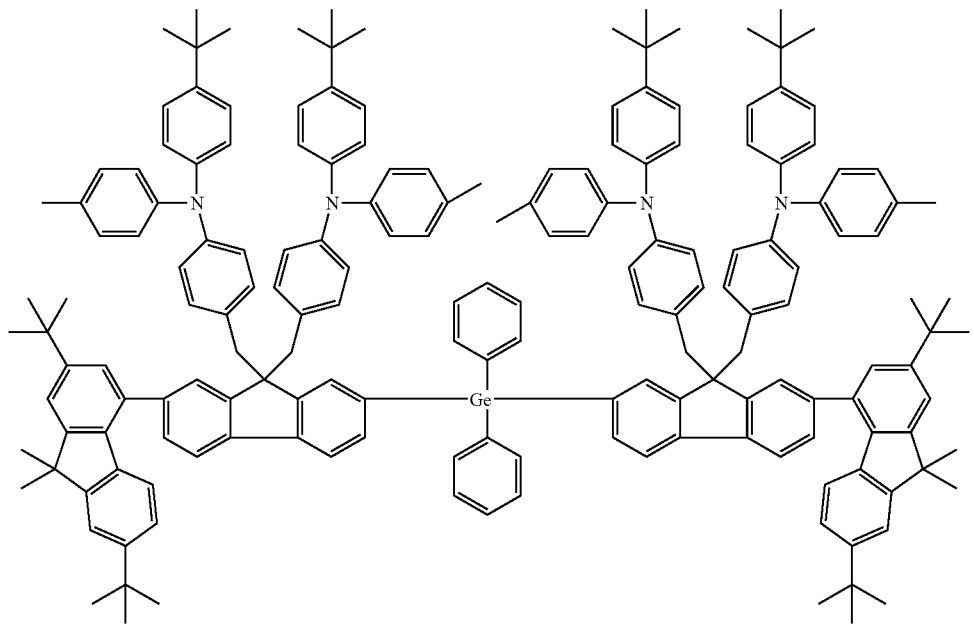
Compound 3
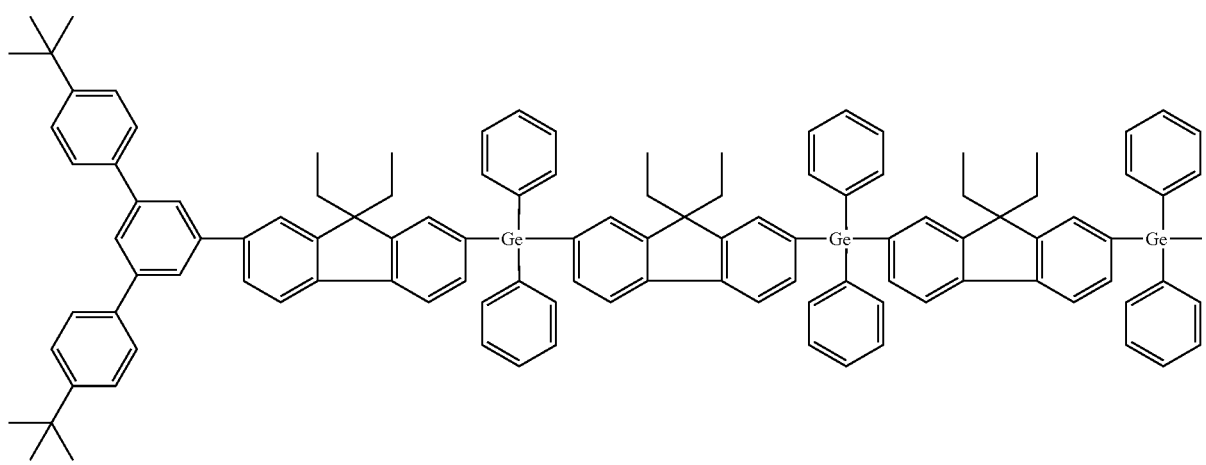
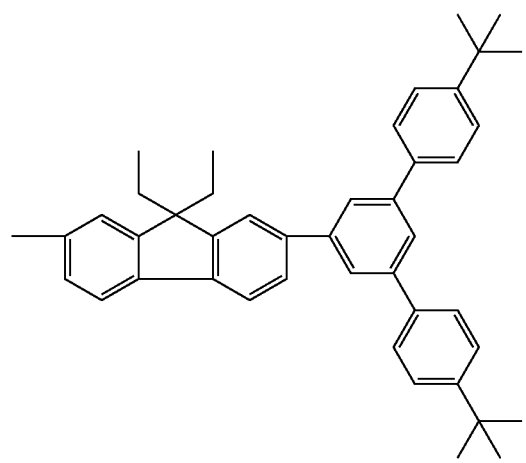

-continued
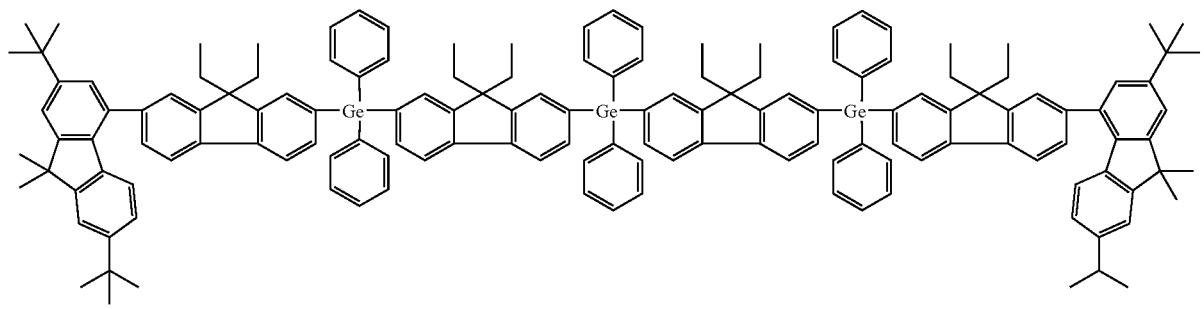
Compound 4
Compound 5
Compound 6
UGH1
UGH2
Synthesis Example 1
Synthesis of Compound 1
Compound 1 was synthesized according to the following synthesis scheme.
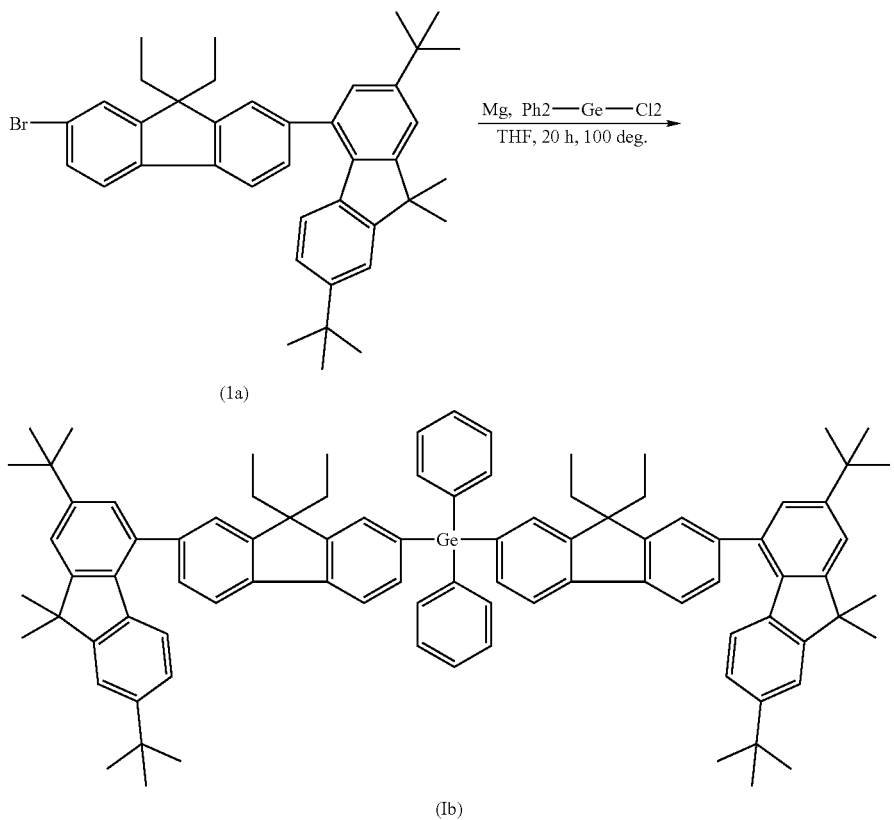
(1a)
(1b)

First, 1 g (1.6 mmol) of Compound (1a) and 50 ml of dehydrated THF were put in a three-necked flask (300 ml). After that, under argon flow, 0.039 g (1.6 mmol) of Mg was put in the mixture, and the whole was stirred at room temperature, whereby a Grignard reagent was prepared. 0.24 g (0.8 mmol) of diphenylgermanium dichloride was put in the Grignard reagent, and then the temperature of the reaction solution was gradually increased to 100° C. After that, the reaction solution was stirred with heating for 20 hours while the temperature was maintained. After the completion of the reaction, the resultant was purified by column chromatography (developing solvent: heptane/toluene 1/1), whereby 0.57 g of Compound (1b) (Compound 1) was obtained (54% yield).

Synthesis Example 2

Synthesis of Compound 2

Compound 2 was synthesized according to the following synthesis scheme.

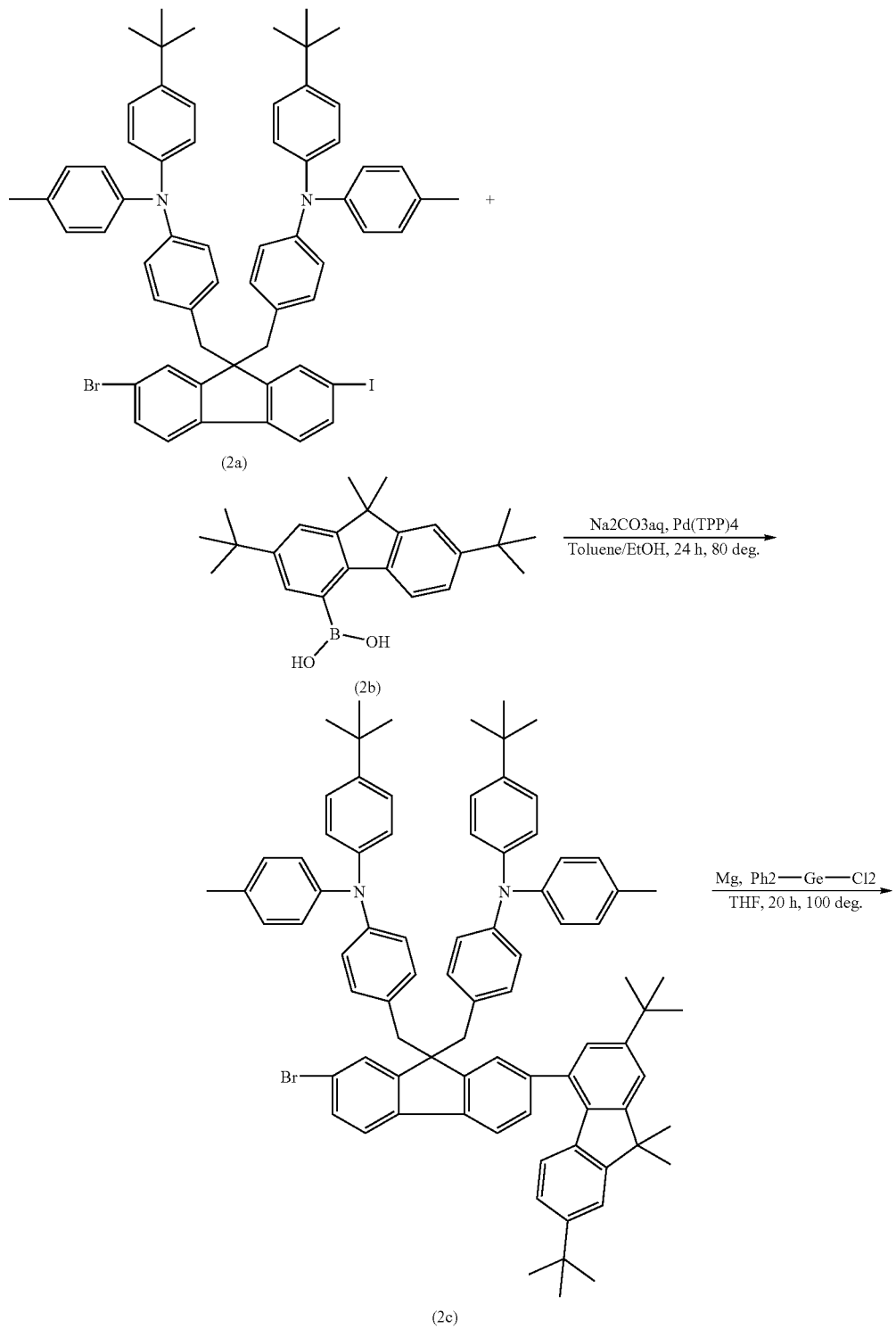

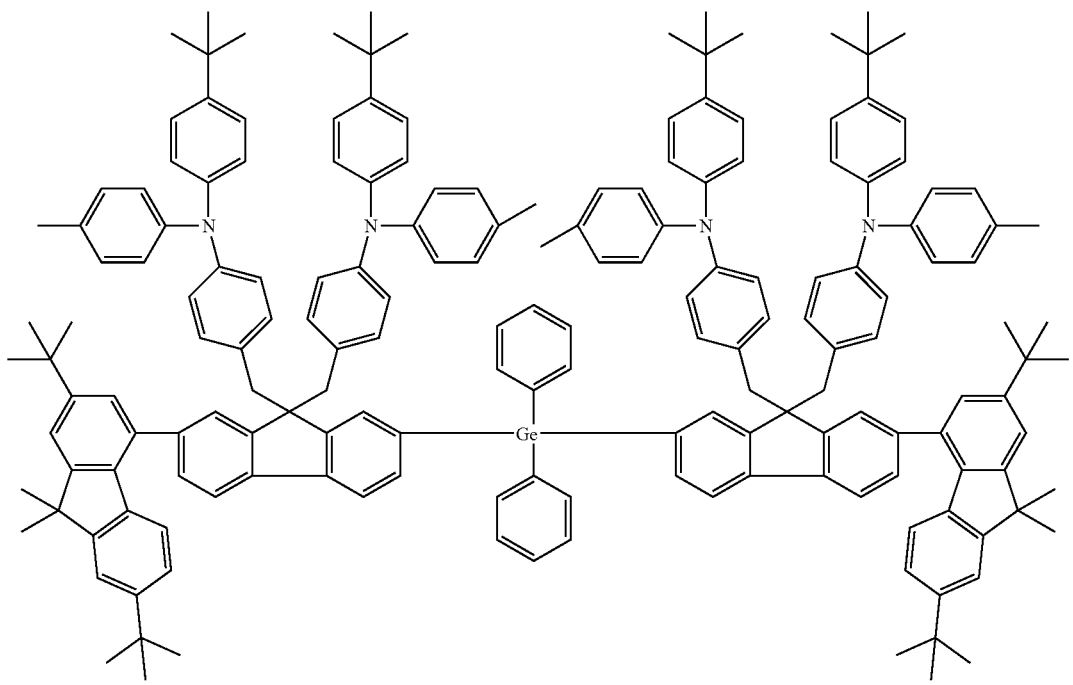

(2c)

(1) First, reagents and solvents shown below were put in a three-necked flask (300 ml).
Compound (2a): 1.03 g (1 mmol)
Compound (2b): 0.35 g (1 mmol)
Toluene/ethanol mixed solvent (weight ratio: toluene/ethanol=4/1): 100 ml
Saturated aqueous solution of $Na_2CO_3$: 20 ml
Next, 0.12 g (0.1 mmol) of tetrakis(triphenylphosphine) palladium was added to the mixture, and the whole was stirred at 80° C. for 24 hours in a nitrogen atmosphere within the flask. After the completion of the reaction, the resultant was purified by column chromatography (developing solvent: heptane/chloroform=5/1), whereby 0.82 g of Compound (2c) was obtained (68% yield).

(2) First, 1.2 g (1 mmol) of Compound (2c) and 60 ml of dehydrated THF were put in a three-necked flask (300 ml). After that, under argon flow, Mg (1 mmol) was put in the mixture, and the whole was stirred at room temperature, whereby a Grignard reagent was prepared. 0.15 g (0.5 mmol) of diphenylgermanium dichloride was put in the Grignard reagent, and then the temperature of the reaction solution was gradually increased to 100° C. After that, the reaction solution was stirred with heating for 20 hours while the temperature was maintained. After the completion of the reaction, the resultant was purified by column chromatography (developing solvent: heptane/toluene=1/1), whereby 0.51 g of Compound (2c) (Compound 2) was obtained (41% yield).

Synthesis Example 3

Synthesis of Compound 3

Compound 3 was synthesized according to the following synthesis scheme.

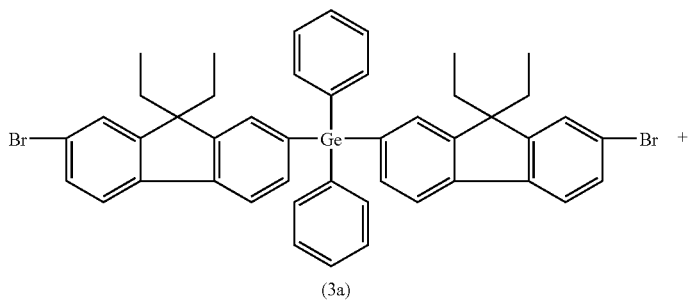

(3a)

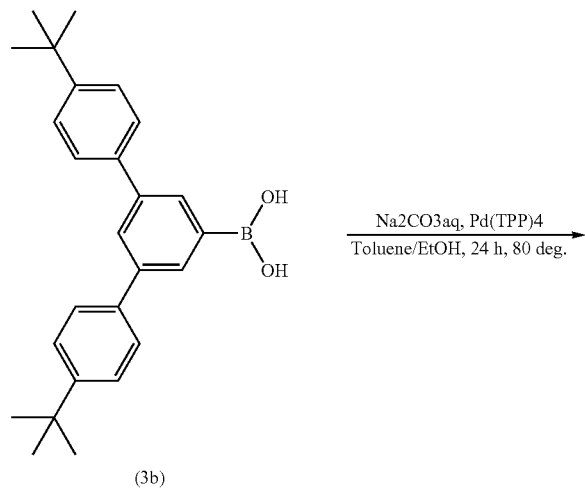
(3b)
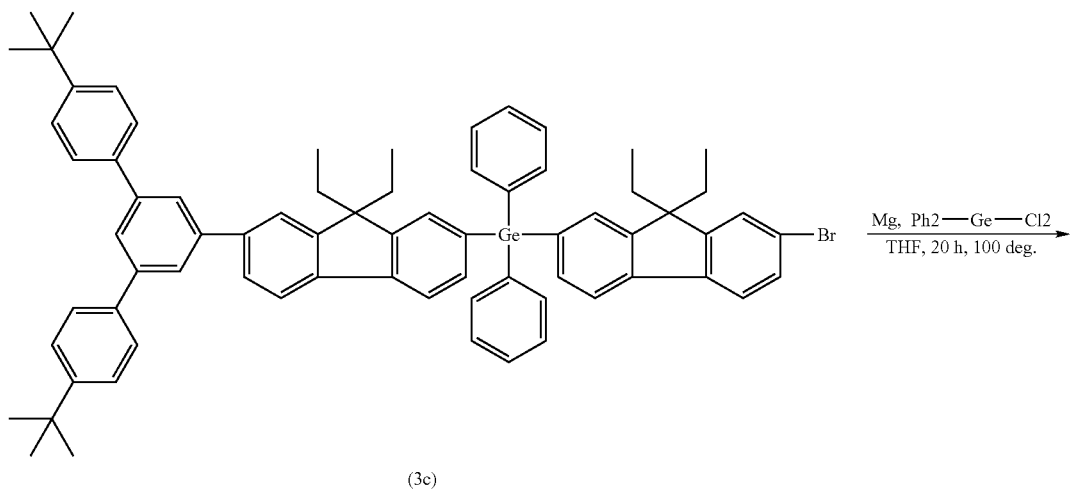
(3c)
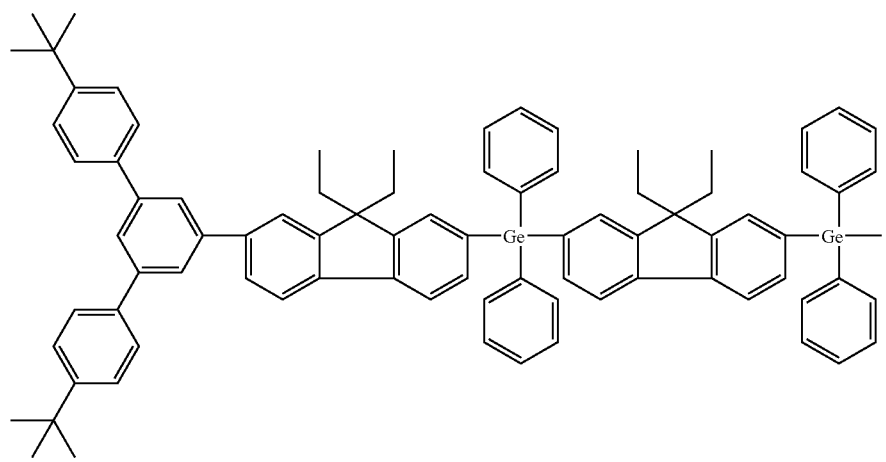

-continued

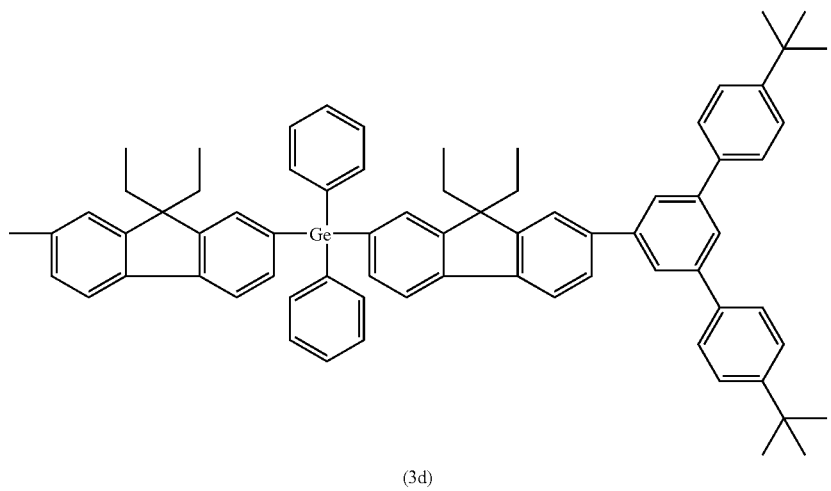

(3d)

(1) First, reagents and solvents shown below were put in a three-necked flask (1 L).

Compound (3a): 8.3 g (10 mmol)

Compound (3b): 3.8 g (1 mmol)

Toluene/ethanol mixed solvent (weight ratio: toluene/ethanol=4/1): 350 ml

Saturated aqueous solution of $Na_2CO_3$: 50 ml

Next, 0.92 g (0.8 mmol) of tetrakis(triphenylphosphine)palladium was added to the mixture, and the whole was stirred at 80° C. for 24 hours in a nitrogen atmosphere within the flask. After the completion of the reaction, the resultant was purified by column chromatography (developing solvent: heptane/chloroform=5/1), whereby 2.83 g of Compound (3c) was obtained (26% yield).

(2) 1.2 g (1.1 mmol) of Compound (3c) and 60 ml of dehydrated THF were put in a three-necked flask (300 ml). After that, under argon flow, Mg (1 mmol) was put in the mixture, and the whole was stirred at room temperature, whereby a Grignard reagent was prepared. 0.16 g (0.55 mmol) of diphenylgermanium dichloride was put in the Grignard reagent, and then the temperature of the reaction solution was gradually increased to 100° C. After that, the reaction solution was stirred with heating for 20 hours while the temperature was maintained. After the completion of the reaction, the resultant was purified by column chromatography (developing solvent: heptane/toluene=1/1), whereby 0.23 g of Compound (3d) (Compound 3) was obtained (19% yield).

Synthesis Example 4

Synthesis of Compound 4

0.11 g of Compound 4 was obtained (9.1% yield) by following the same procedure as in Synthesis Example 3 with the exception that Compound (4a) represented by the following formula was used instead of Compound (3b) in Synthesis Example 3.

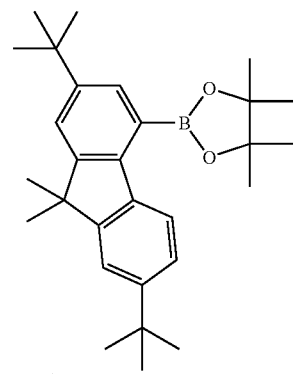

(4a)

(Solubility Test)

Because the organic germanium compound is used as a material constituting the light-emitting layer of the organic electroluminescent device of the present invention, the solubility of the organic germanium compound in various organic solvents serves as an extremely important factor in the formation of a uniform, flat, and stable film. In view of the foregoing, each of Compounds 1 to 6 obtained above was subjected to a 1-wt % solubility test in any one of various organic solvents. To be specific, an organic germanium compound and an organic solvent were mixed such that the weight ratio of the compound to the solvent was 1:99, and the mixture was stirred at room temperature for 1 hour. At that time, the case where a uniform solution could be prepared was evaluated as o, and the case where a uniform solution could not be prepared was evaluated as x. Table 1 below shows the results.

TABLE 1

|  | Solvent | Solubility parameter[*1] $(cal \cdot cm^{-3})^{1/2}$ | Evaluation |
|---|---|---|---|
| Compd. 1 | Diethyl ether | 7.7 | o |
|  | Toluene | 8.9 | o |
|  | Xylene | 8.8-9.0 | o |
|  | Chlorobenzene | 9.5 | o |
|  | Acetonitrile | 11.8 | o |

TABLE 1-continued

| | Solvent | Solubility parameter*[1] $(cal \cdot cm^{-3})^{1/2}$ | Evaluation |
|---|---|---|---|
| Compd. 2 | Diethyl ether | 7.7 | ○ |
| | Toluene | 8.9 | ○ |
| | Xylene | 8.8-9.0 | ○ |
| | Chlorobenzene | 9.5 | ○ |
| | Acetonitrile | 11.8 | ○ |
| Compd. 3 | Diethyl ether | 7.7 | ○ |
| | Toluene | 8.9 | ○ |
| | Xylene | 8.8-9.0 | ○ |
| | Chlorobenzene | 9.5 | ○ |
| | Acetonitrile | 11.8 | ○ |
| Compd. 4 | Diethyl ether | 7.7 | ○ |
| | Toluene | 8.9 | ○ |
| | Xylene | 8.8-9.0 | ○ |
| | Chlorobenzene | 9.5 | ○ |
| | Acetonitrile | 11.8 | ○ |
| Compd. 5 | Diethyl ether | 7.7 | x |
| | Toluene | 8.9 | x |
| | Xylene | 8.8-9.0 | x |
| | Chlorobenzene | 9.5 | x |
| | Acetonitrile | 11.8 | x |
| Compd. 6 | Diethyl ether | 7.7 | x |
| | Toluene | 8.9 | x |
| | Xylene | 8.8-9.0 | x |
| | Chlorobenzene | 9.5 | x |
| | Acetonitrile | 11.8 | x |

*[1] Source: Section 11 of "Solvent Pocketbook, first edition, sixteenth copy" published by the Society of Synthetic Organic Chemistry, Japan Example 1

Production of Organic Electroluminescent Device

An organic electroluminescent device having such a device constitution as shown in FIG. 1B in which the three organic layers were stacked was produced. Here, an organic germanium compound can be formed into a stable film by a deposition method when the compound has a low molecular weight, so that the production of the device utilizing the deposition method is sufficiently attainable. However, in order to show excellent characteristics and superiority appearing when the organic germanium compound is used as a material constituting the device, the organic electroluminescent device was produced by the following method.

First, ITO (transparent electrode 14) having a film thickness of 100 nm was patterned onto a glass substrate (transparent substrate 15) so as to have an electrode area of 3.14 mm². On the substrate having ITO patterned thereon (hereinafter referred to as "substrate with ITO electrode"), all organic layers were formed by a spin coating method. Next, an electrode layer to serve as a cathode was stacked by a vacuum deposition method under a reduced pressure of $10^{-4}$ Pa, whereby an organic electroluminescent device was produced. A specific method for the production will be described below.

(1) Hole Injecting/Transporting Layer 13 (Film Thickness: 400 Å)

A PEDOT/PSS Al 4083 (trade name; manufactured by Baytron Ltd.) was formed into a film by a spin coating method (in a nitrogen atmosphere at 2,000 rpm for 2 minutes, followed by drying at 200° C.) on the substrate with the ITO electrode.

(2) Interlayer 16 (Film Thickness: 200 Å)

Polyvinyl carbazole (PVK) (manufactured by Sigma-Aldrich Co.) was formed into a film by a spin coating method (in a nitrogen atmosphere at 2,000 rpm for 2 minutes, followed by drying at 200° C.) on the hole injecting/transporting layer 13 (PEDOT/PSS film).

(3) Light-Emitting Layer 12 (Film Thickness: 400 Å)

Compound 1 serving as a host and an Ir complex serving as a guest, having an emission peak at 509 nm, and represented by the following formula (hereinafter referred to as "Ir(mppy)$_3$") were weighed such that the weight ratio of the compound to the complex was 95:5. Here, Ir(mppy)$_3$ is an Ir complex obtained according to the synthesis method described in Advanced Materials, 13, 1245 (2001). Next, the host and the guest were dissolved in toluene, whereby a 1.0-wt % toluene solution was prepared. The toluene solution was formed into a film by a spin coating method (in a nitrogen atmosphere at 2,000 rpm for 1 min) on the interlayer 16. After the film formation, the film was heated to 80° C. and dried so that the solvent was removed.

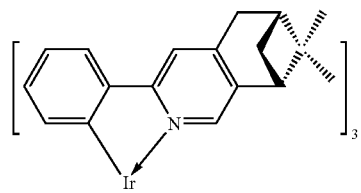

(4) Metal Electrode 11

A CsF film was formed by a vapor deposition method. At that time, the thickness of the CsF film was set to 50 Å. An Al film was formed by a vapor deposition method thereon. At that time, the thickness of the Al film was set to 1,200 Å.

The resultant device was evaluated for its characteristics. As a result, the device had a current efficiency of 40 cd/A, had a peak in its light emission spectrum at 511 nm, and had CIE chromaticity coordinates of (x, y)=(0.29, 0.66).

In addition, the device was subjected to a luminance durability test (an initial luminance: 1,000 cd/m²). As a result, the luminance half-life period (the time it takes for the initial luminance to decrease to its half, that is, 500 cd/m²) was 105 hours.

Examples 2 to 4

Devices were each produced by following the same procedure as in Example 1 with the exception that each of Compounds 2 to 4 was used instead of Compound 1 as the host of the light-emitting layer 12 in Example 1. The resultant devices were each evaluated in the same manner as in Example 1. Table 2 shows the results.

Example 5

A device was produced by following the same procedure as in Example 1 with the exception that a mixture of Compound 1 and Compound 7 represented by the following formula (weight mixing ratio: Compound 1/Compound 7=3/1) was used instead of Compound 1 as the host of the light-emitting layer 12 in Example 1. The resulting device was evaluated in the same manner as in Example 1. Table 2 shows the results. Incidentally, the $T_1$ level determined from the phosphorescence spectrum of Compound 7 was 2.99 eV, which was higher than the $T_1$ level of Ir(mppy)$_3$ used as the guest.

Compound 7

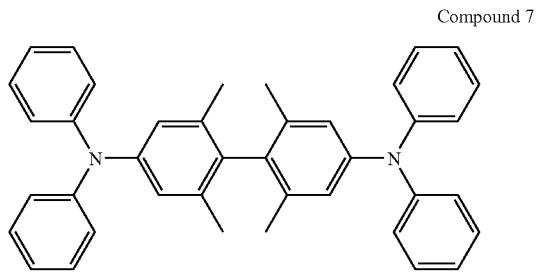

Comparative Examples 1 and 2

Devices were each produced by following the same procedure as in Example 1 with the exception that each of Compounds 5 and 6 was used instead of Compound 1 as the host of the light-emitting layer 12 in Example 1. The resulting devices were each evaluated in the same manner as in Example 1. Table 2 shows the results.

Incidentally, in each of Comparative Example 1 and Comparative Example 2, a 1.0-wt % toluene solution could not be prepared because the compound used as the host did not show solubility in toluene. In view of the foregoing, attempts were made to use various solvents. As a result, it was found that about 0.4 wt % of the compound dissolved in chloroform. Accordingly, a film to serve as the light-emitting layer 12 was formed by using the chloroform solution with the rotation frequency of the spinner being set to 800 rpm for 1 minute. When the film was heated and dried at 80° C. after its formation, the film was observed to show a whitening phenomenon. In addition, the driving voltage of the device of each of Comparative Example 1 and Comparative Example 2 was high; the device of Comparative Example 1 underwent quenching (short-circuited) at a luminance of 820 cd/m², and the device of Comparative Example 2 underwent quenching (short-circuited) at a luminance of 790 cd/m².

TABLE 2

| | Light-emitting layer | Current efficiency (cd/A) | Peak (nm) | CIE chromaticity coordinates (x, y) | Luminance half-life period (h) |
|---|---|---|---|---|---|
| Ex. 1 | Compd. 1 | 40 | 511 | (0.29, 0.66) | 105 |
| Ex. 2 | Compd. 2 | 45 | 512 | (0.29, 0.66) | 98 |
| Ex. 3 | Compd. 3 | 35 | 511 | (0.29, 0.67) | 75 |
| Ex. 4 | Compd. 4 | 32 | 511 | (0.30, 0.66) | 72 |
| Ex. 5 | Compd. 1 + Compd. 7 | 46 | 510 | (0.30, 0.67) | 101 |
| Comp. Ex. 1 | Compd. 5 (UGH1) | 2*¹ | 520 | (0.32, 0.64) | <5*³ |
| Comp. Ex. 2 | Compd. 6 (UGH2) | 1*² | 519 | (0.33, 0.63) | <5*³ |

*¹The device underwent quenching (short-circuited) at a luminance of 820 cd/m².
*²The device underwent quenching (short-circuited) at a luminance of 790 cd/m².
*³Luminance at the beginning of measurement: 500 cd/m²

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-160051, filed Jun. 18, 2007, which is hereby incorporated by reference herein in its entirety.

What is claimed is:

1. An organic electroluminescent device comprising:

an anode and a cathode; and a layer comprising an organic compound interposed between the anode and the cathode, wherein the layer contains at least one organic germanium compound having two or more fluorenyl groups per one germanium atom, wherein the organic germanium compound comprises a compound represented by the general formula [1]:

[1]

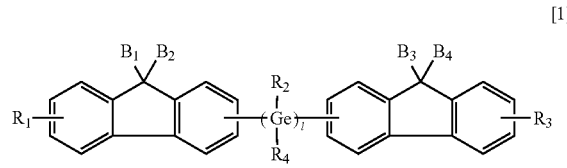

wherein $R_1$, $R_2$, $R_3$, and $R_4$ each represent, independently of one another, a substituted or unsubstituted phenyl group, a substituted or unsubstituted biphenyl group, a substituted or unsubstituted terphenyl group, a substituted or unsubstituted naphthalenyl group, or a substituted or unsubstituted fluorenyl group; $B_1$, $B_2$, $B_3$, and $B_4$ each represent, independently of one another, a linear or branched alkyl group having 1 to 20 carbon atoms; and l represents an integer of 1 to 4.

2. An organic electroluminescent device comprising:

an anode and a cathode; and a layer comprising an organic compound interposed between the anode and the cathode, wherein the layer contains at least one organic germanium compound having two or more fluorenyl groups per one germanium atom, wherein the organic germanium compound comprises a compound represented by the general formula [2]:

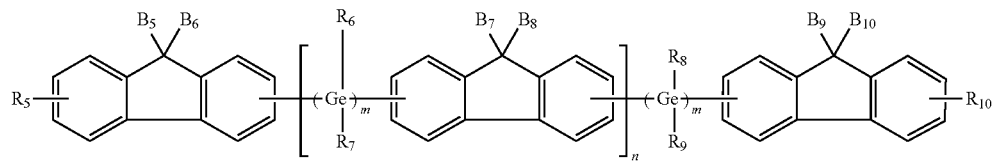

wherein $R_5$, $R_6$, $R_7$, $R_8$, $R_9$, and $R_{10}$ each represent, independently of one another, a substituted or unsubstituted phenyl group, a substituted or unsubstituted biphenyl group, a substituted or unsubstituted terphenyl group, a substituted or unsubstituted naphthalenyl group, or a substituted or unsubstituted fluorenyl group; $B_5$, $B_6$, $B_7$, $B_8$, $B_9$, and $B_{10}$ each represent, independently of one another, a linear or branched alkyl group having 1 to 20 carbon atoms; n represents an integer of 1 to 20; and m represents an integer of 1 to 4.

3. The organic electroluminescent device according to claim 1 or claim 2, wherein the organic germanium compound is contained in a light-emitting layer together with at least one fluorescent material or phosphorescent material.

4. The organic electroluminescent device according to claim 3, further containing at least one carrier transporting compound in the light-emitting layer.

5. The organic electroluminescent device according to claim 3, wherein the light-emitting layer is formed by a wet process.

6. The organic electroluminescent device according to claim 5, wherein when the light-emitting layer is formed by the wet process, an ink for application prepared by dissolving the organic germanium compound in an organic solvent having a solubility parameter of 6.5 $(cal \cdot cm^{-3})^{1/2}$ to 13.0 $(cal \cdot cm^{-3})^{1/2}$ at a concentration of 1.0 wt % or more is used.

* * * * *